US012666670B2

(12) United States Patent
Hisada et al.

(10) Patent No.: US 12,666,670 B2
(45) Date of Patent: Jun. 23, 2026

(54) SEMICONDUCTOR DEVICE WITH SOURCE REGION HAVING MULTIPLE PORTIONS WITH DIFFERENT IMPULITY CONCENTRATIONS AND METHOD FOR THE SAME

(71) Applicants: Kabushiki Kaisha Toshiba, Tokyo (JP); Toshiba Electronic Devices & Storage Corporation, Tokyo (JP)

(72) Inventors: Junpei Hisada, Nonoichi Ishikawa (JP); Hiroaki Katou, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 559 days.

(21) Appl. No.: 18/179,059

(22) Filed: Mar. 6, 2023

(65) Prior Publication Data

US 2024/0096962 A1 Mar. 21, 2024

(30) Foreign Application Priority Data

Sep. 21, 2022 (JP) ................................. 2022-150004
Dec. 9, 2022 (JP) ................................. 2022-197259

(51) Int. Cl.
*H10D 62/13* (2025.01)
*H10D 30/01* (2025.01)
(Continued)

(52) U.S. Cl.
CPC ....... *H10D 62/154* (2025.01); *H10D 30/0295* (2025.01); *H10D 30/668* (2025.01);
(Continued)

(58) Field of Classification Search
CPC ............. H10D 62/154; H10D 30/0295; H10D 30/668; H10D 64/252; H10D 30/0297;
(Continued)

(56) References Cited

U.S. PATENT DOCUMENTS 9,882,036 B2 1/2018 Kono et al.
2004/0159885 A1* 8/2004 Kawano ............. H10D 64/2527
257/330
(Continued)

FOREIGN PATENT DOCUMENTS

JP 2008-117826 A 5/2008
JP 5388495 B2 1/2014
(Continued)

OTHER PUBLICATIONS

Notice of Reasons for Refusal mailed Jan. 30, 2026 in corresponding Japanese Patent Application No. 2022-197259, with English machine translation, 11 pages.

*Primary Examiner* — Mohammad M Hoque
(74) *Attorney, Agent, or Firm* — Kim & Stewart LLP

(57) ABSTRACT

According to one embodiment, a semiconductor device includes a first electrode, first to fourth semiconductor regions, a gate electrode, and a second electrode. The third semiconductor region is located on a portion of the second semiconductor region. The fourth semiconductor region includes a first portion positioned on the third semiconductor region and a second portion arranged with the first portion in a second direction. A first-conductivity-type impurity concentration of the first portion is less than a first-conductivity-type impurity concentration of the second portion. The gate electrode faces the second semiconductor region via a gate insulating layer in the second direction. The second electrode is located on the second and fourth semiconductor regions. The second electrode contacts the first and second portions. The second electrode includes a connection part (Continued)

that contacts the third semiconductor region and the portion of the second semiconductor region in the second direction.

17 Claims, 18 Drawing Sheets

(51) Int. Cl.

| | |
|---|---|
| *H10D 30/66* | (2025.01) |
| *H10D 64/23* | (2025.01) |
| *H10P 30/20* | (2026.01) |
| *H10P 30/22* | (2026.01) |

(52) U.S. Cl.
CPC ......... *H10D 64/252* (2025.01); *H10P 30/204* (2026.01); *H10P 30/21* (2026.01); *H10P 30/22* (2026.01)

(58) Field of Classification Search
CPC .. H10D 64/256; H10D 62/127; H10D 62/393; H10D 64/117; H01L 21/26513; H01L 21/266

USPC ........................................................ 257/330
See application file for complete search history.

(56) References Cited

U.S. PATENT DOCUMENTS

| | | | |
|---|---|---|---|
| 2008/0135929 A1 | 6/2008 | Saito et al. | |
| 2011/0233663 A1* | 9/2011 | Hamada ................. | H10D 30/63 |
| | | | 257/E29.264 |
| 2015/0372090 A1* | 12/2015 | Oosawa ............... | H10D 64/519 |
| | | | 438/270 |
| 2018/0182886 A1* | 6/2018 | Kobayashi ........... | H10D 64/518 |
| 2020/0152748 A1* | 5/2020 | Okumura ............. | H10D 64/251 |
| 2021/0296489 A1* | 9/2021 | Kishimoto ........... | H10D 64/256 |
| 2022/0310830 A1* | 9/2022 | Tanabe ................. | H10D 62/145 |

FOREIGN PATENT DOCUMENTS

| | | |
|---|---|---|
| JP | 2014158013 A | 8/2014 |
| JP | 6526591 B2 | 6/2019 |
| JP | 2019-197835 A | 11/2019 |
| JP | 2021-150535 A | 9/2021 |

* cited by examiner

SEMICONDUCTOR DEVICE WITH SOURCE REGION HAVING MULTIPLE PORTIONS WITH DIFFERENT IMPULITY CONCENTRATIONS AND METHOD FOR THE SAME

CROSS-REFERENCE TO RELATED APPLICATIONS

This application is based upon and claims the benefit of priority from Japanese Patent Application No. 2022-150004, filed on Sep. 21, 2022, and Japanese Patent Application No. 2022-197259, filed on Dec. 9, 2022; the entire contents of which are incorporated herein by reference.

FIELD

Embodiments described herein relate generally to a semiconductor device and a method for the same.

BACKGROUND

Semiconductor devices such as metal oxide semiconductor field effect transistors (MOSFETs) and the like are used in power conversion and other applications. It is desirable to reduce the characteristic fluctuation between such semiconductor devices.

DETAILED DESCRIPTION

Figure 1:
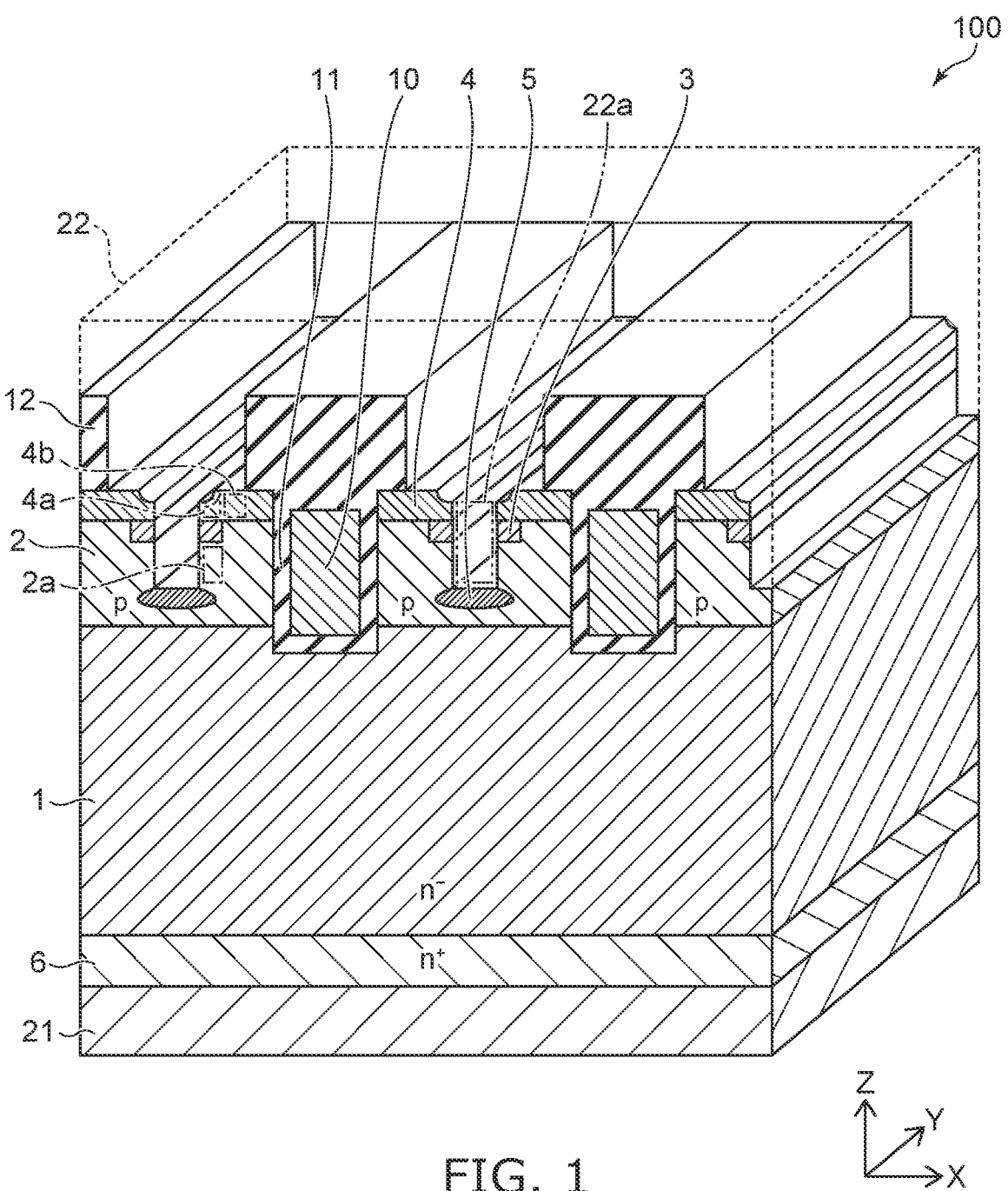
FIG. 1 is a perspective cross-sectional view showing a portion of a semiconductor device according to a first embodiment.

According to one embodiment, a semiconductor device includes a first electrode, a first semiconductor region, a second semiconductor region, a third semiconductor region, a fourth semiconductor region, a gate electrode, a second electrode. The first semiconductor region is located on the first electrode. The first semiconductor region is of a first conductivity type. The second semiconductor region is located on the first semiconductor region. The second semiconductor region is of a second conductivity type. The third semiconductor region is located on a portion of the second semiconductor region. The third semiconductor region is of the second conductivity type. A second-conductivity-type impurity concentration of the third semiconductor region is greater than a second-conductivity-type impurity concentration of the second semiconductor region. The fourth semiconductor region includes a first portion and a second portion. The fourth semiconductor region is of the first conductivity type. The first portion is positioned on the third semiconductor region. The second portion is arranged with the first portion in a second direction perpendicular to a first direction. The first direction being from the first electrode toward the first semiconductor region. A first-conductivity-type impurity concentration of the first portion is less than a first-conductivity-type impurity concentration of the second portion. The gate electrode faces the second semiconductor region via a gate insulating layer in the second direction. The second electrode is located on the second and fourth semiconductor regions. The second electrode contacts the first and second portions. The second electrode includes a connection part. The connection part contacts the third semiconductor region and the portion of the second semiconductor region in the second direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

In the following descriptions and drawings, notations of $n^+$, $n^-$ and $p^+$, $p$ represent relative heights of impurity concentrations in conductivity types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

FIG. 1 is a perspective cross-sectional view showing a portion of a semiconductor device according to a first embodiment.

The semiconductor device 100 according to the first embodiment is a MOSFET. As shown in FIG. 1, the semiconductor device 100 includes an $n^-$-type (first-conductivity-type) drift region 1 (a first semiconductor region), a p-type (second-conductivity-type) base region 2 (a second semiconductor region), a $p^+$-type contact region 3 (a third semiconductor region), an $n^+$-type source region 4 (a fourth semiconductor region), a $p^+$-type contact region 5 (a fifth semiconductor region), an $n^+$-type drain region 6, a gate electrode 10, a gate insulating layer 11, an insulating layer 12, a drain electrode 21 (a first electrode), and a source electrode 22 (a second electrode). The source electrode 22 is shown by a broken line in FIG. 1.

An XYZ orthogonal coordinate system is used in the description of the embodiments. The direction from the drain electrode 21 toward the $n^-$-type drift region 1 is taken as a Z-direction (a first direction). Two mutually-orthogonal directions perpendicular to the Z-direction are taken as an X-direction (a second direction) and a Y-direction (a third direction). In the description, the direction from the drain electrode 21 toward the $n^-$-type drift region 1 is called "up", and the opposite direction is called "down". These directions are based on the relative positional relationship between the drain electrode 21 and the $n^-$-type drift region 1 and are independent of the direction of gravity.

The drain electrode 21 is located at the lower surface of the semiconductor device 100. The $n^+$-type drain region 6 is located on the drain electrode 21 and is electrically connected with the drain electrode 21. The $n^-$-type drift region 1 is located on the $n^+$-type drain region 6. The $n^-$-type drift region 1 is electrically connected with the drain electrode 21 via the $n^+$-type drain region 6. The n-type impurity concentration of the $n^-$-type drift region 1 is less than the n-type impurity concentration of the $n^+$-type drain region 6.

The p-type base region 2 is located on the $n^-$-type drift region 1. The $p^+$-type contact region 3 is located on a portion of the p-type base region 2 (a contact portion 2a). The p-type impurity concentration of the $p^+$-type contact region 3 is greater than the p-type impurity concentration of the p-type base region 2.

The $n^+$-type source region 4 is located on the p-type base region 2 and the $p^+$-type contact region 3. The $n^+$-type source region 4 includes a first portion 4a and a second portion 4b. The first portion 4a is located on the $p^+$-type contact region 3. The second portion 4b is arranged with first portion 4a in the X-direction.

The gate electrode 10 faces the p-type base region 2 via the gate insulating layer 11 in the X-direction. In the illustrated example, the gate electrode 10 faces a portion of the $n^-$-type drift region 1, the p-type base region 2, and a portion of the $n^+$-type source region 4 via the gate insulating layer 11.

The source electrode 22 is located at the upper surface of the semiconductor device 100 and is positioned on the p-type base region 2 and the $n^+$-type source region 4. The source electrode 22 includes a connection part 22a. The connection part 22a extends downward and is arranged with the contact portion 2a, the $p^+$-type contact region 3, and the $n^+$-type source region 4 in the X-direction. The contact portion 2a and the $p^+$-type contact region 3 are positioned between the gate electrode 10 and the connection part 22a in the X-direction.

The $p^+$-type contact region 5 is located between the p-type base region 2 and the connection part 22a in the Z-direction. A portion of the $p^+$-type contact region 5 may be located around the lower end of the connection part 22a in the X-Y plane. The p-type impurity concentration of the $p^+$-type contact region 5 is greater than the p-type impurity concentration of the p-type base region 2.

The $p^+$-type contact region 5 is positioned lower than the $p^+$-type contact region 3 and is separated from the $p^+$-type contact region 3. The contact portion 2a of the p-type base region 2 is positioned between the $p^+$-type contact region 3 and the $p^+$-type contact region 5. The p-type impurity concentration of the $p^+$-type contact region 3 may be equal to the p-type impurity concentration of the $p^+$-type contact region 5. Favorably, the p-type impurity concentration of the $p^+$-type contact region 3 is less than the p-type impurity concentration of the $p^+$-type contact region 5.

The connection part 22a contacts the contact portion 2a, the $p^+$-type contact region 3, the first portion 4a, and the $p^+$-type contact region 5; and the source electrode 22 and these semiconductor regions are electrically connected. The source electrode 22 also contacts the upper surface of the first portion 4a and the upper surface of the second portion 4b. The insulating layer 12 is located between the gate electrode 10 and the source electrode 22. The source electrode 22 is electrically isolated from the gate electrode 10 by the insulating layer 12.

Figure 2:
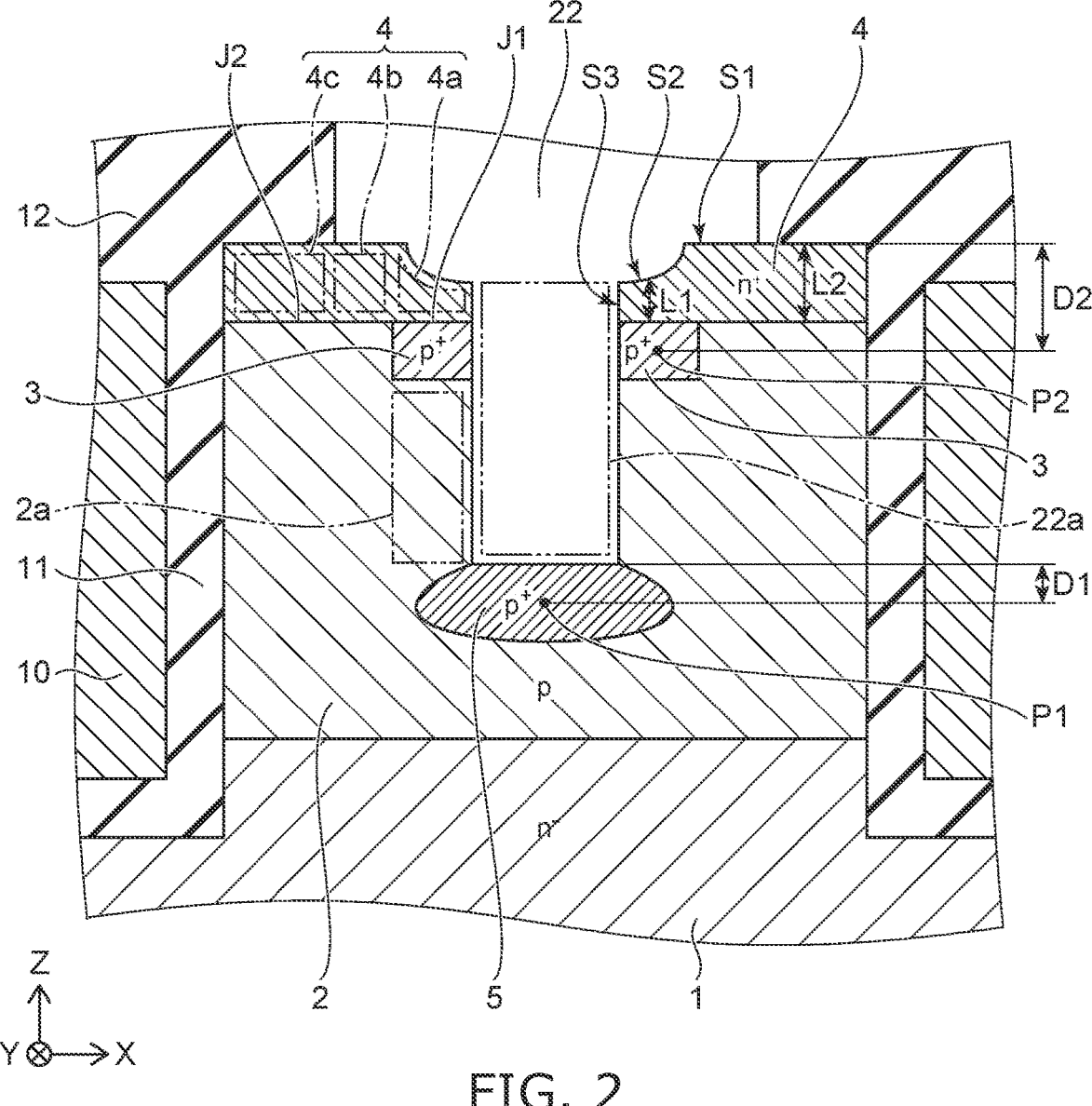
FIG. 2 is an enlarged cross-sectional view of a portion of FIG. 1.

FIG. 2 is an enlarged cross-sectional view of a portion of FIG. 1.

The $p^+$-type contact region 3 and the $p^+$-type contact region 5 each have p-type impurity concentration gradients in the Z-direction. As shown in FIG. 2, the $p^+$-type contact region 5 has a peak of the p-type impurity concentration at a first position P1 in the Z-direction. The $p^+$-type contact region 3 has a peak of the p-type impurity concentration at a second position P2 in the Z-direction.

For example, the impurity concentration gradients of the $p^+$-type contact region 3 and the $p^+$-type contact region 5 are measured along the Z-direction at a cross section of the semiconductor device 100. At this time, maximum values of the p-type impurity concentration occur at the first and second positions P1 and P2. It is favorable for a first distance D1 in the Z-direction from the interface between the $p^+$-type contact region 5 and the connection part 22a to the first position P1 to be less than a second distance D2 in the Z-direction from the upper surface of the $n^+$-type source region 4 to the second position P2.

The first and second portions 4a and 4b of the $n^+$-type source region 4 contact the source electrode 22 in the Z-direction. The $n^+$-type source region 4 may further include a third portion 4c covered with the insulating layer 12. The second portion 4b is positioned between the first portion 4a and the third portion 4c in the X-direction. The n-type impurity concentration of the first portion 4a is less than the n-type impurity concentration of the second portion 4b and less than the n-type impurity concentration of the third portion 4c.

The first portion 4a contacts the $p^+$-type contact region 3. The second portion 4b and the third portion 4c contact the p-type base region 2. In the illustrated example, a first junction J1 between the p$^+$-type contact region 3 and the first portion 4a is positioned at the same height as a second junction J2 between the p-type base region 2 and the second portion 4b. The "height" corresponds to the Z-direction position.

An example of the dimensional relationship of the components will now be described. The Z-direction length of the p$^+$-type contact region 3 is less than the Z-direction distance between the p$^+$-type contact region 5 and the p$^+$-type contact region 3. A length L1 in the Z-direction of the first portion 4a is less than a length L2 in the Z-direction of the second portion 4b. The distance from the p-n junction between the n$^-$-type drift region 1 and the p-type base region 2 to the lower end of the p$^+$-type contact region 5 is greater than the distance from the interface between the p$^+$-type contact region 5 and the connection part 22a to the lower end of the p$^+$-type contact region 5.

The outer edge of the p$^+$-type contact region 3 is determined based on the p-type impurity concentration of the p-type base region 2 and the p-type impurity concentration of the p$^+$-type contact region 3. The set of points having an intermediate value between the maximum p-type impurity concentration of the p$^+$-type contact region 3 and the p-type impurity concentration of the p-type base region 2 at a position separated from the p$^+$-type contact region 3 corresponds to the outer edge of the p$^+$-type contact region 3. Similarly, the set of points having an intermediate value between the maximum p-type impurity concentration of the p$^+$-type contact region 5 and the p-type impurity concentration of the p-type base region 2 at a position separated from the p$^+$-type contact region 5 corresponds to the outer edge of the p$^+$-type contact region 5.

The upper surface of the second portion 4b includes a first surface S1 along the X-Y plane. The upper surface of the first portion 4a includes a second surface S2 that is oblique to the X-direction and the Z-direction. The second surface S2 is linked to the first surface S1. The second surface S2 may be parallel to one direction or may be curved downward in a convex shape as illustrated. The first portion 4a further includes a third surface S3 linked to the second surface S2. The tilt of the third surface S3 with respect to the Z-direction is less than the tilt of the second surface S2 with respect to the Z-direction. The third surface S3 may be parallel to the Z-direction.

As shown in FIG. 1, the p-type base region 2, the p$^+$-type contact region 3, the n$^+$-type source region 4, the p$^+$-type contact region 5, the gate electrode 10, the insulating layer 12, and the connection part 22a each extend in the Y-direction and are multiply arranged in the X-direction.

Figure 3:
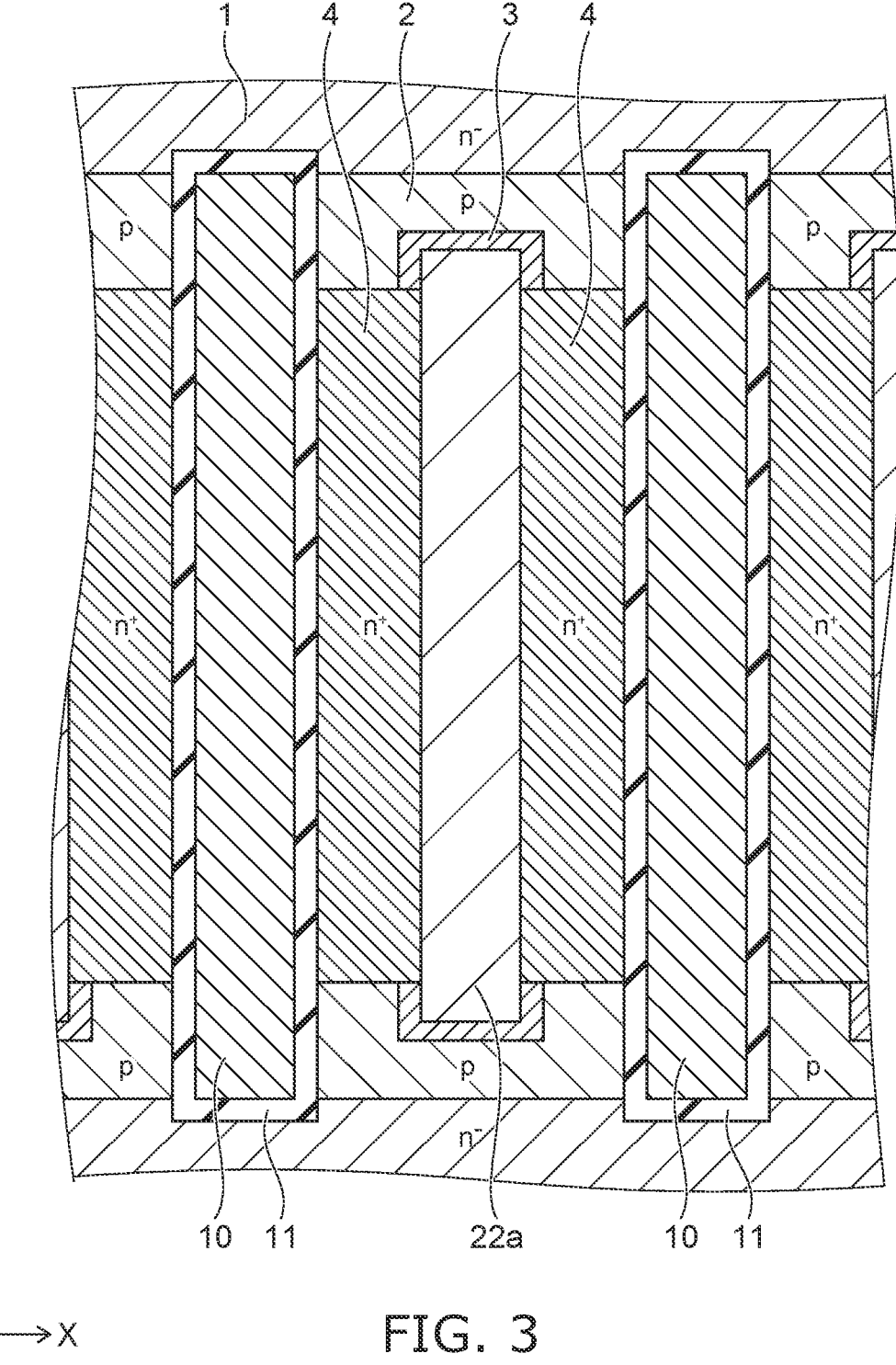
FIG. 3 is a plan view showing a portion of the semiconductor device according to the first embodiment.

FIG. 3 is a plan view showing a portion of the semiconductor device according to the first embodiment. FIG. 3 shows the structure in the X-Y cross section passing through the n$^+$-type source region 4 and the gate electrode 10.

As shown in FIG. 3, one connection part 22a is positioned on one p-type base region 2. One p$^+$-type contact region 3 is located around one connection part 22a along the X-Y plane. The width of the p$^+$-type contact region 3 is substantially constant around the connection part 22a. A pair of n$^+$-type source regions 4 that is separated from each other in the X-direction is located on one p-type base region 2 and one p$^+$-type contact region 3.

Operations of the semiconductor device 100 will now be described.

A voltage that is not less than a threshold is applied to the gate electrode 10 in a state in which a positive voltage with respect to the source electrode 22 is applied to the drain electrode 21. A channel (an inversion layer) is formed in the p-type base region 2; and the semiconductor device 100 is set to the on-state. Electrons flow from the source electrode 22 toward the drain electrode 21 via the channel. When the voltage that is applied to the gate electrode 10 drops below the threshold, the channel in the p-type base region 2 disappears, and the semiconductor device 100 is switched to the off-state.

When the semiconductor device 100 is switched to the off-state, the voltage of the drain electrode 21 with respect to the source electrode 22 rises. As the voltage rises, a large number of carriers are generated when breakdown occurs inside the semiconductor device 100. Electrons move toward the n$^+$-type drain region 6 and are discharged from the drain electrode 21. Holes pass through the p-type base region 2, the p$^+$-type contact region 3, and the p$^+$-type contact region 5 and are discharged from the source electrode 22.

Examples of the materials of the components will now be described.

The n$^-$-type drift region 1, the p-type base region 2, the p$^+$-type contact region 3, the n$^+$-type source region 4, the V-type contact region 5, and the n$^+$-type drain region 6 include silicon, silicon carbide, gallium nitride, or gallium arsenide as a semiconductor material. Arsenic, phosphorus, or antimony can be used as an n-type impurity when silicon is used as the semiconductor material. Boron can be used as a p-type impurity.

The gate electrode 10 includes a conductive material such as polysilicon, etc. The gate insulating layer 11 and the insulating layer 12 include insulating materials such as silicon oxide, silicon nitride, silicon oxynitride, etc. The drain electrode 21 and the source electrode 22 include metals such as titanium, tungsten, aluminum, etc.

FIGS. 4A to 8B are cross-sectional views showing a method for manufacturing the semiconductor device according to the first embodiment.

Figure 4A:
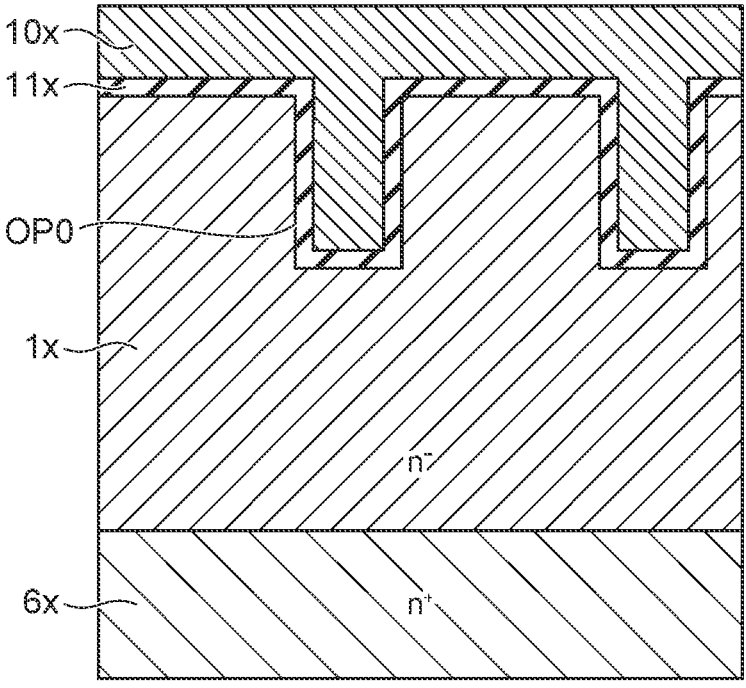
FIGS. 4A and 4B are cross-sectional views showing a method for manufacturing the semiconductor device according to the first embodiment.

First, a semiconductor substrate that includes an n$^+$-type semiconductor layer 6x and an n$^-$-type semiconductor layer 1x (the first impurity region) is prepared. The n$^-$-type semiconductor layer 1x is located on the n$^+$-type semiconductor layer 6x. An opening OP0 is formed in the n$^-$-type semiconductor layer 1x by photolithography and reactive ion etching (RIE). An insulating layer 11x is formed along the inner surface of the opening OP0 and the upper surface of the n$^-$-type semiconductor layer 1x by thermal oxidation. As shown in FIG. 4A, a conductive layer 10x is formed on the insulating layer 11x by chemical vapor deposition (CVD).

Figure 4B:
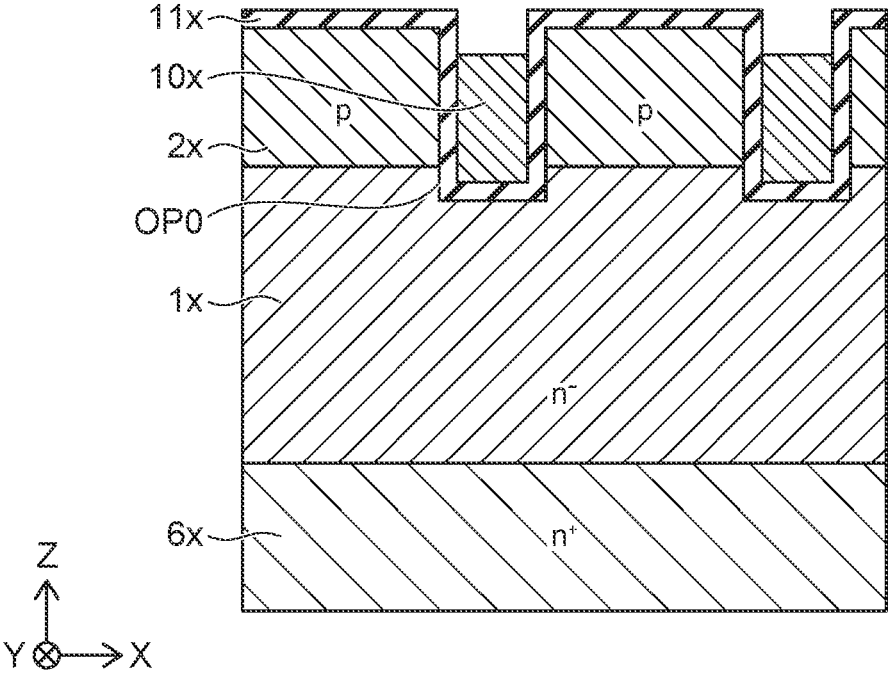

The upper surface of the conductive layer 10x is caused to recede by chemical mechanical polishing (CMP) and chemical dry etching (CDE). The multiple conductive layers 10x that are separated from each other are formed respectively inside the multiple openings OP0. As shown in FIG. 4B, a p-type semiconductor region 2x (the second impurity region) is formed by ion-implanting a p-type impurity into the upper surface of the n$^-$-type semiconductor layer 1x. The direction from the n$^-$-type semiconductor layer 1x toward the p-type semiconductor region 2x is parallel to the Z-direction.

Figure 5A:
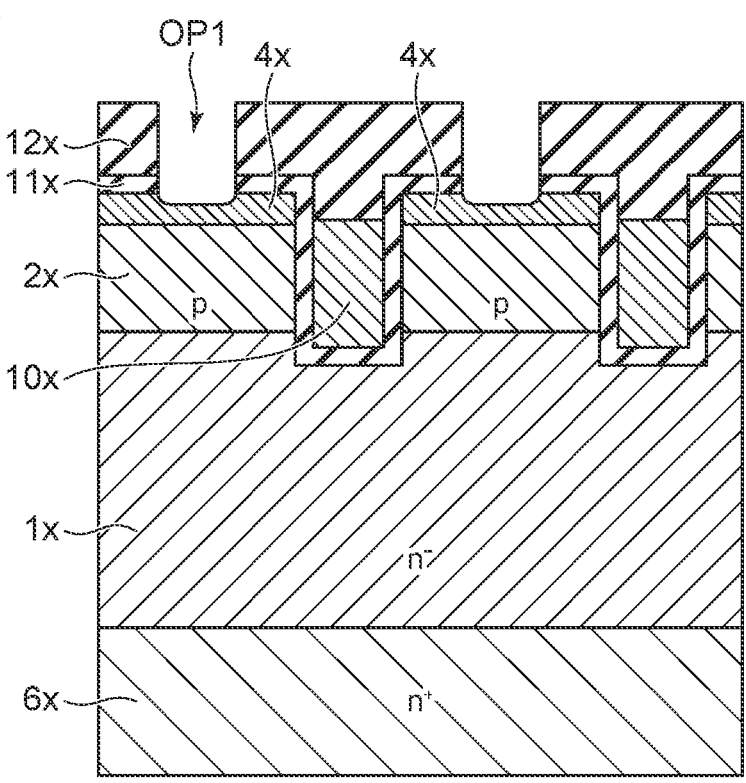
FIGS. 5A and 5B are cross-sectional views showing the method for manufacturing the semiconductor device according to the first embodiment.

An n$^+$-type semiconductor region 4x (the third impurity region) is formed by ion-implanting an n-type impurity into the upper surface of the p-type semiconductor region 2x. An insulating layer 12x is formed on the insulating layer 11x by CVD. The insulating layer 12x includes silicon oxide. As shown in FIG. 5A, an opening OP1 is formed in the insulating layers 11x and 12x by removing a portion of the insulating layer 11x and a portion of the insulating layer 12x by photolithography and RIE. A portion of the n$^+$-type semiconductor region 4x is exposed via the opening OP1.

The RIE when forming the opening OP1 causes the position of the upper surface of the exposed portion of the n$^+$-type semiconductor region 4$x$ to be lower than the position of the upper surface of the other portion of the n$^+$-type semiconductor region 4$x$.

A structure body that includes the n$^-$-type semiconductor layer 1$x$ (the first impurity region), the p-type semiconductor region 2$x$ (the second impurity region), the n$^+$-type semiconductor region 4$x$ (the third impurity region), and the insulating layers 11$x$ and 12$x$ (a first insulating layer) having the opening OP1 (a first opening) is made by the processes up to this point.

Figure 5B:
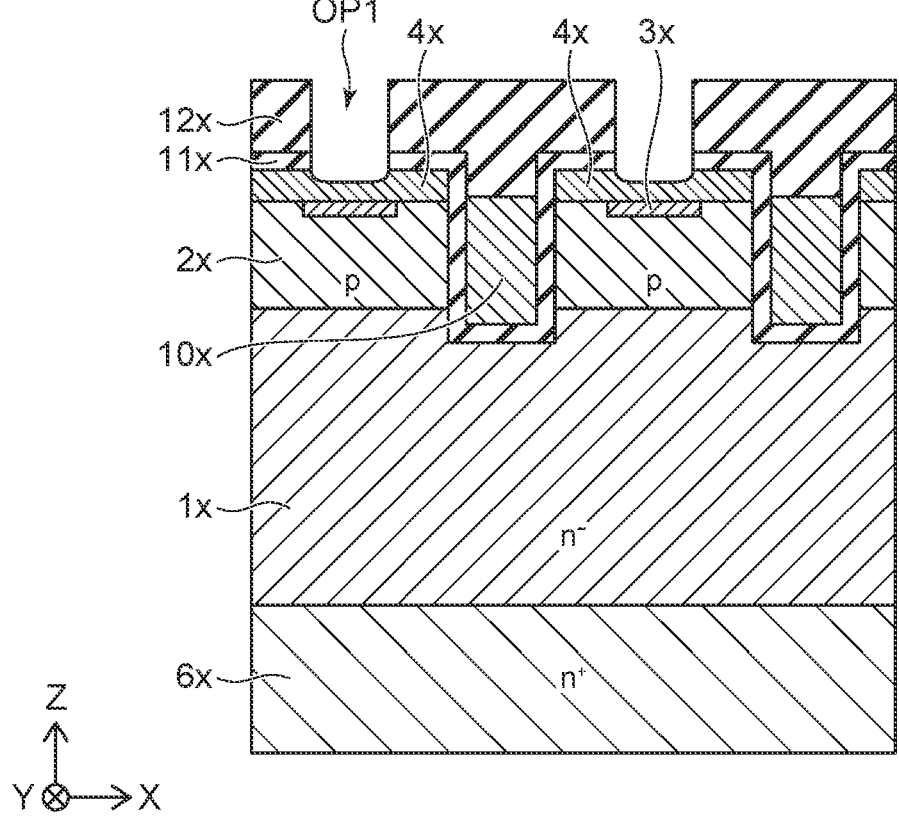

A p-type impurity is ion-implanted into the p-type semiconductor region 2$x$ via the opening OP1. Thereby, as shown in FIG. 5B, a p$^+$-type semiconductor region 3$x$ (the fourth impurity region) is formed. When performing the ion implantation, the acceleration voltage is adjusted so that the peak position of the p-type impurity concentration in the p$^+$-type semiconductor region 3$x$ is positioned lower than the n$^+$-type semiconductor region 4$x$. The p-type impurity concentration of the p$^+$-type semiconductor region 3$x$ is greater than the p-type impurity concentration of the p-type semiconductor region 2$x$. The p-type impurity also is implanted into the exposed portion of the n$^+$-type semiconductor region 4$x$. Therefore, the n-type impurity concentration of the exposed portion of the n$^+$-type semiconductor region 4$x$ is less than the n-type impurity concentration of the other portion of the n$^+$-type semiconductor region 4$x$.

Figure 6A:
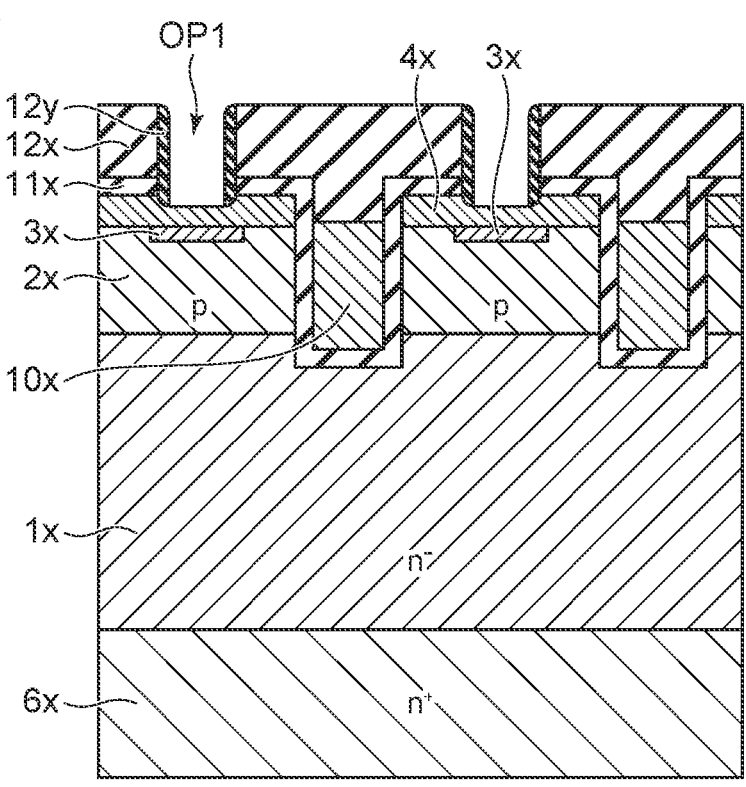
FIGS. 6A and 6B are cross-sectional views showing the method for manufacturing the semiconductor device according to the first embodiment.

An insulating layer 12$y$ is formed along the surfaces of the insulating layers 11$x$ and 12$x$ by CVD. For example, the insulating layer 12$y$ includes silicon oxide or silicon nitride. The insulating layer 12$y$ that is located at the upper surface of the insulating layer 12$x$ and the bottom portion of the opening OP1 is removed by RIE. Thereby, as shown in FIG. 6A, the insulating layer 12$y$ remains only at the side surface of the opening OP1.

Figure 6B:
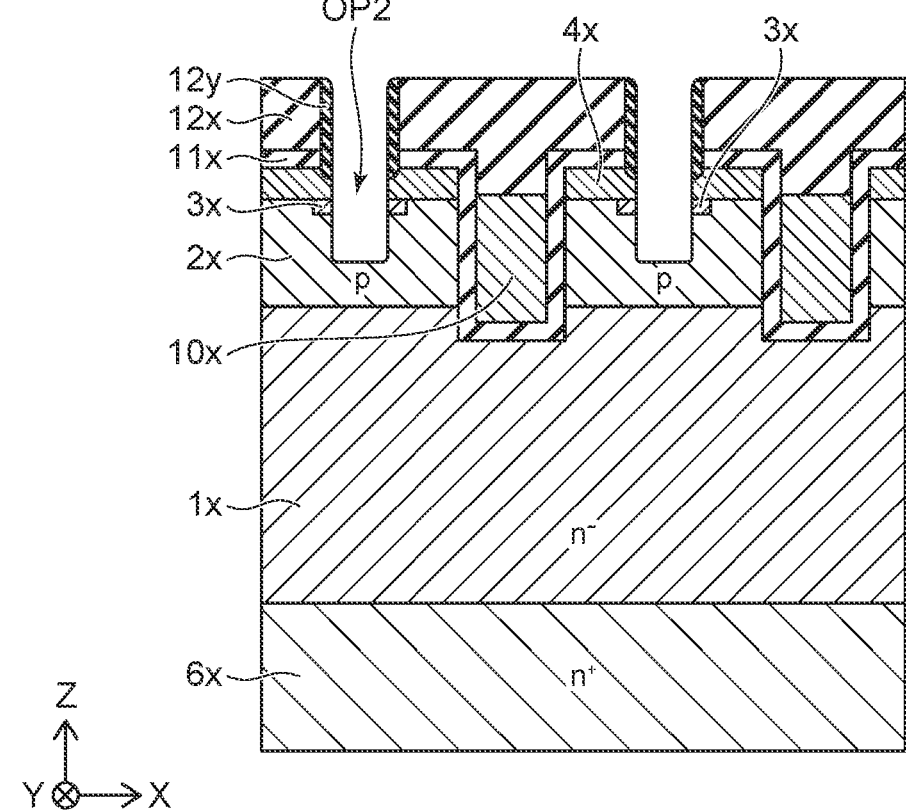

A portion of the p-type semiconductor region 2$x$, a portion of the p$^+$-type semiconductor region 3$x$, and a portion of the n$^+$-type semiconductor region 4$x$ are removed via the opening OP1 by RIE using the insulating layers 12$x$ and 12$y$ as a mask. As shown in FIG. 6B, an opening OP2 (a second opening) is formed thereby. The width of the opening OP2 is less than the width of the opening OP1 when the p$^+$-type semiconductor region 3$x$ is formed. Therefore, the p$^+$-type semiconductor region 3$x$ remains in portions of the two side surfaces of the opening OP2.

Figure 7A:
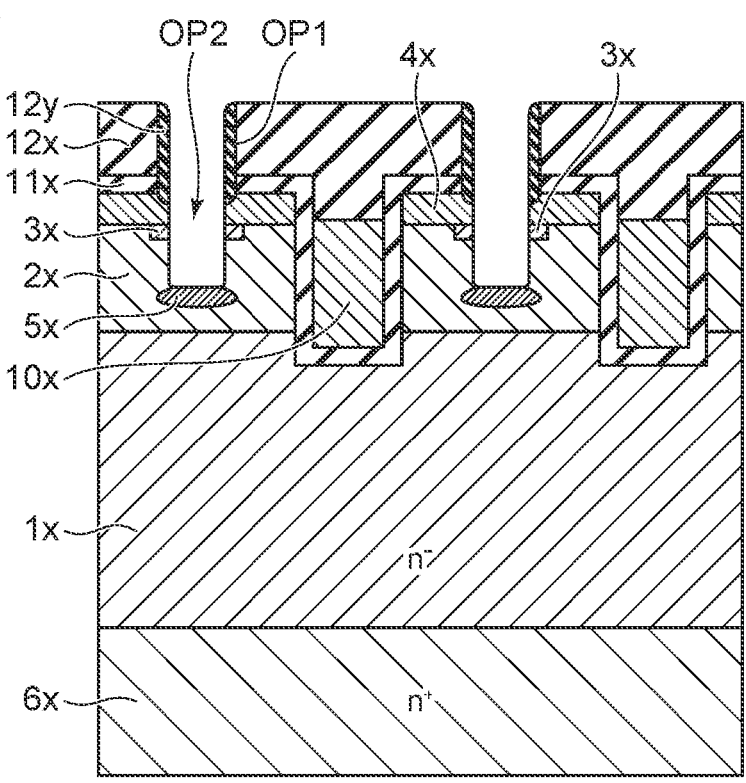
FIGS. 7A and 7B are cross-sectional views showing the method for manufacturing the semiconductor device according to the first embodiment.

A p-type impurity is ion-implanted into the p-type semiconductor region 2$x$ via the opening OP2. Thereby, a p$^+$-type semiconductor region 5$x$ (the fifth impurity region) is formed at the bottom portion of the opening OP2 as shown in FIG. 7A. When performing the ion implantation, the acceleration voltage is adjusted so that the peak of the p-type impurity concentration of the p$^+$-type semiconductor region 5$x$ is positioned at the bottom surface vicinity of the opening OP2. For example, the acceleration voltage of the ion implantation for forming the p$^+$-type semiconductor region 5$x$ is set to be less than the acceleration voltage of the ion implantation for forming the p$^+$-type semiconductor region 3$x$.

Figure 7B:
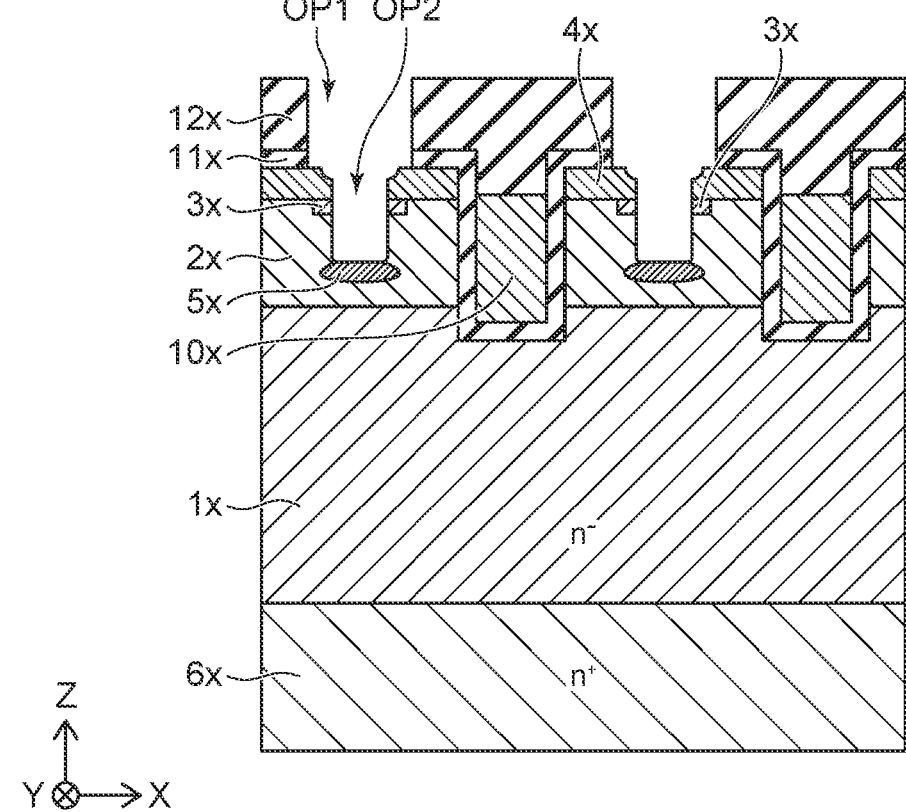

The insulating layer 12$y$ is removed. As shown in FIG. 7B, the width of the insulating layer 11$x$ and the width of the insulating layer 12$x$ are reduced by isotropic etching such as chemical dry etching (CDE), etc. Thereby, a portion of the n$^+$-type semiconductor region 4$x$ covered with the insulating layers 11$x$, 12$x$, and 12$y$ is exposed.

Figure 8A:
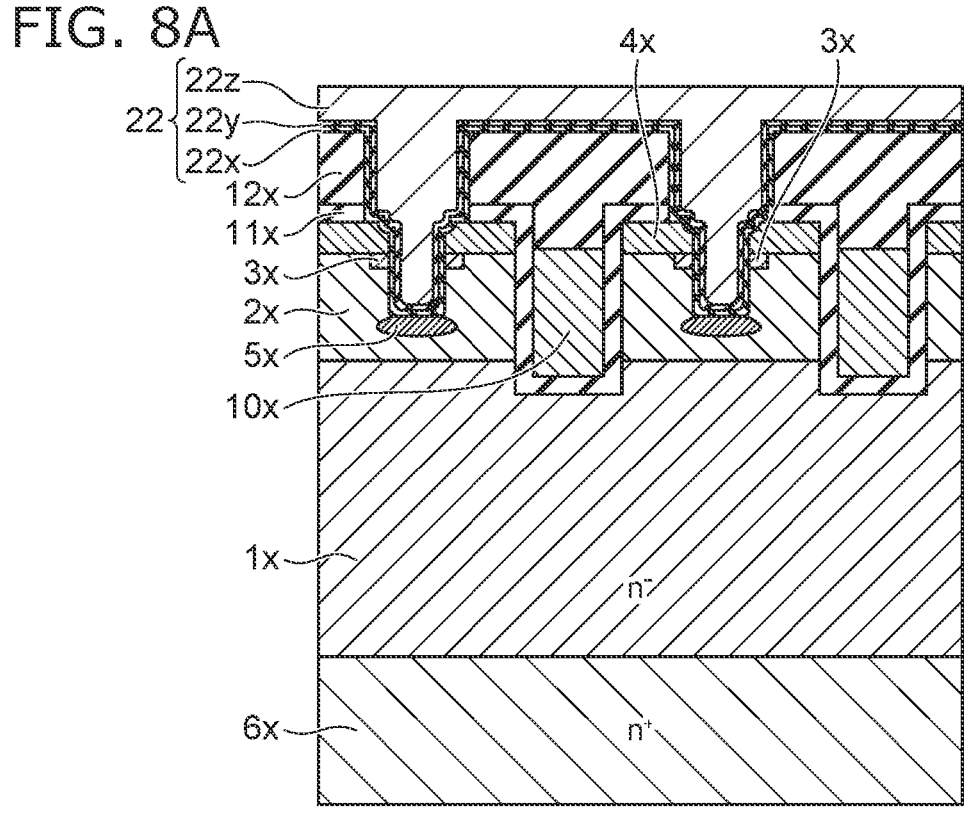
FIGS. 8A and 8B are cross-sectional views showing the method for manufacturing the semiconductor device according to the first embodiment.

A metal layer 22$x$ is formed along the inner surface of the opening OP1, the inner surface of the opening OP2, and the upper surface of the insulating layer 12$x$ by sputtering. The metal layer 22$x$ includes titanium. A metal layer 22$y$ is formed along the surface of the metal layer 22$x$ by sputtering. The metal layer 22$y$ includes titanium nitride. As shown in FIG. 8A, a metal layer 22$z$ that fills the openings OP1 and OP2 is formed on the metal layer 22$y$. The metal layer 22$z$ includes aluminum. The source electrode 22 that is made of the metal layers 22$x$ to 22$z$ is formed.

Figure 8B:
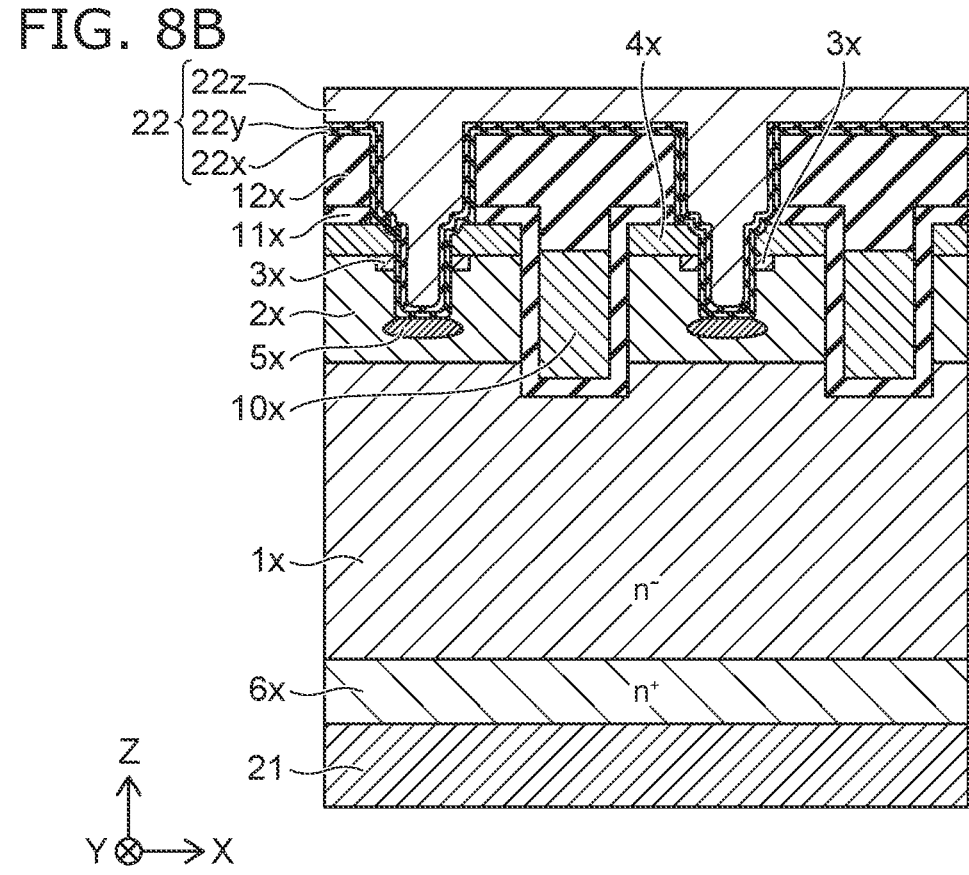

The lower surface of the n$^+$-type semiconductor layer 6$x$ is polished until the n$^+$-type semiconductor layer 6$x$ becomes a prescribed thickness. As shown in FIG. 8B, the drain electrode 21 is formed on the lower surface of the polished n$^+$-type semiconductor layer 6$x$ by sputtering aluminum. Thus, the semiconductor device 100 according to the first embodiment is manufactured.

The n$^-$-type semiconductor layer 1$x$ shown in FIG. 8B corresponds to the n$^-$-type drift region 1 shown in FIG. 1. The p-type semiconductor region 2$x$ corresponds to the p-type base region 2. The p$^+$-type semiconductor region 3$x$ corresponds to the p$^+$-type contact region 3. The n$^+$-type semiconductor region 4$x$ corresponds to the n$^+$-type source region 4. The p$^+$-type semiconductor region 5$x$ corresponds to the p$^+$-type contact region 5. The n$^+$-type semiconductor layer 6$x$ corresponds to the n$^+$-type drain region 6. The conductive layer 10$x$ corresponds to the gate electrode 10. A portion of the insulating layer 11$x$ corresponds to the gate insulating layer 11. The insulating layer 12$x$ and another portion of the insulating layer 11$x$ correspond to the insulating layer 12.

Advantages of the first embodiment will now be described.

The semiconductor device 100 includes a parasitic bipolar transistor made of the n$^-$-type drift region 1, the p-type base region 2, and the n$^+$-type source region 4. The potential of the p-type base region 2 rises when holes pass through the p-type base region 2. The parasitic bipolar transistor may operate when the potential difference between the p-type base region 2 and the n$^+$-type source region 4 increases. When the parasitic bipolar transistor operates, a large current flows in the semiconductor device 100, and breakdown of the semiconductor device 100 occurs. To suppress the operation of the parasitic bipolar transistor, it is desirable to reduce the potential difference between the p-type base region 2 and the n$^+$-type source region 4.

The conductivity of holes in the p$^+$-type contact region 5 is greater than the conductivity of holes in the p-type base region 2. By providing the p$^+$-type contact region 5, the holes are more easily discharged to the source electrode 22; and the rise of the potential of the p-type base region 2 is suppressed. The potential difference between the p-type base region 2 and the n$^+$-type source region 4 can be reduced. The semiconductor device 100 according to the first embodiment further includes the p$^+$-type contact region 3. By providing the p$^+$-type contact region 3, the potential difference between the p-type base region 2 and the n$^+$-type source region 4 can be further reduced, and the operation of the parasitic bipolar transistor can be further suppressed.

To suppress the operation of the parasitic bipolar transistor, it also may be considered to provide the p$^+$-type contact region 3 over the entire region between the n$^+$-type source region 4 and the p$^+$-type contact region 5. However, in such a case, the p-type impurity that is included in the p$^+$-type contact region 3 easily diffuses to the gate insulating layer 11 vicinity in the manufacturing process of the semiconductor device 100. The diffusion of the p-type impurity causes the threshold of the voltage for switching between the on-state and the off-state of the semiconductor device 100 to fluctuate.

In the semiconductor device 100 according to the first embodiment, the $p^+$-type contact region 3 is separated from the $p^+$-type contact region 5. The electron concentration is higher in the region at the vicinity of the $n^+$-type source region 4 than in regions separated from the $n^+$-type source region 4. By providing the $p^+$-type contact region 3 in the region at which the electron concentration is higher, the fluctuation of the threshold of the voltage due to the diffusion of the p-type impurity can be suppressed. The characteristic fluctuation between the semiconductor devices 100 can be suppressed, and the reliability of the semiconductor device 100 can be increased.

In the semiconductor device 100 according to the first embodiment, the first and second portions 4a and 4b of the $n^+$-type source region 4 contact the source electrode 22. Not only does the first portion 4a positioned on the $p^+$-type contact region 3 contact the source electrode 22, but the second portion 4b that is arranged with the first portion 4a in the X-direction also contacts the source electrode 22. The electrical resistance between the $n^+$-type source region 4 and the source electrode 22 can be reduced thereby, and the on-resistance of the semiconductor device 100 can be reduced. In other words, the $p^+$-type contact region 3 is separated from the gate insulating layer 11 in the X-direction so that the $p^+$-type contact region 3 is positioned only under the first portion 4a. By setting the width of the $p^+$-type contact region 3 to be narrower, the fluctuation of the threshold of the voltage of the gate electrode 10 due to the diffusion of the p-type impurity from the $p^+$-type contact region 3 can be further suppressed.

It is favorable for the n-type impurity concentration of the first portion 4a to be less than the n-type impurity concentration of the second portion 4b. When the impurities of the $p^+$-type contact region 3 and the $n^+$-type source region 4 are activated by heating in the manufacturing process of the semiconductor device 100, the p-type impurity and the n-type impurity diffuse respectively from the $p^+$-type contact region 3 and the $n^+$-type source region 4. When the n-type impurity diffuses from the $n^+$-type source region 4 into the $p^+$-type contact region 3, the p-type impurity concentration of the $p^+$-type contact region 3 is reduced, and the electrical resistance to the holes of the $p^+$-type contact region 3 is increased. As a result, the potential difference between the p-type base region 2 and the $n^+$-type source region 4 can be increased. When the n-type impurity concentration of the first portion 4a is less than the n-type impurity concentration of the second portion 4b, the diffusion amount of the n-type impurity from the first portion 4a into the $p^+$-type contact region 3 can be reduced. As a result, the fluctuation of the p-type impurity concentration of the $p^+$-type contact region 3 can be reduced, and the reduction of the p-type impurity concentration of the $p^+$-type contact region 3 can be suppressed. The characteristic fluctuation between the semiconductor devices 100 can be further suppressed, and the reliability of the semiconductor device 100 can be improved even more.

It is favorable for the p-type impurity concentration of the $p^+$-type contact region 3 to be less than the p-type impurity concentration of the $p^+$-type contact region 5. By setting the p-type impurity concentration of the $p^+$-type contact region 3 to be lower, the fluctuation of the threshold of the voltage of the gate electrode 10 can be further suppressed.

As shown in FIG. 2, it is favorable for the first distance D1 from the interface between the $p^+$-type contact region 5 and the connection part 22a to the first position P1 to be less than the second distance D2 from the upper surface of the $n^+$-type source region 4 to the second position P2. As the first distance D1 is reduced, the second position P2 can be moved away from the p-n junction between the $n^-$-type drift region 1 and the p-type base region 2. As the second position P2 is moved away from the p-n junction between the $n^-$-type drift region 1 and the p-type base region 2, the depletion layer spreads more easily to the p-type base region 2 when the semiconductor device 100 is in the off-state. The breakdown voltage of the semiconductor device 100 can be increased.

Advantages of the manufacturing method according to the first embodiment will now be described.

FIGS. 9A to 10B are cross-sectional views showing a method for manufacturing a semiconductor device according to a reference example.

Figure 9A:
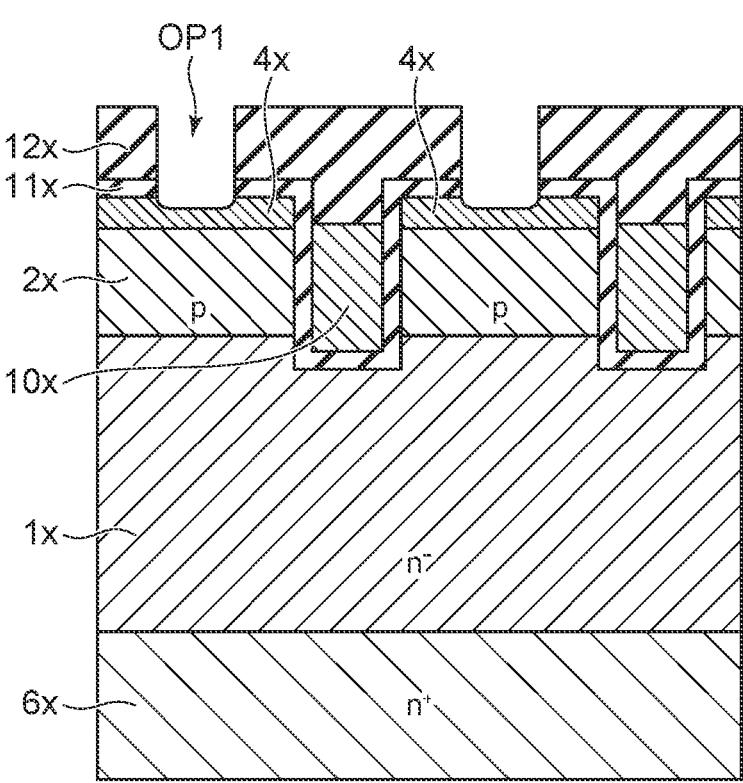
FIGS. 9A and 9B are cross-sectional views showing a method for manufacturing a semiconductor device according to a reference example.

According to the manufacturing method according to the reference example, first, the p-type semiconductor region 2x, the $n^+$-type semiconductor region 4x, the conductive layer 10x, the insulating layer 11x, and the insulating layer 12x are formed on a semiconductor substrate that includes the $n^-$-type semiconductor layer 1x and the $n^+$-type semiconductor layer 6x. As shown in FIG. 9A, the opening OP1 is formed by removing a portion of the insulating layer 11x and a portion of the insulating layer 12x by photolithography and RIE.

Figure 9B:
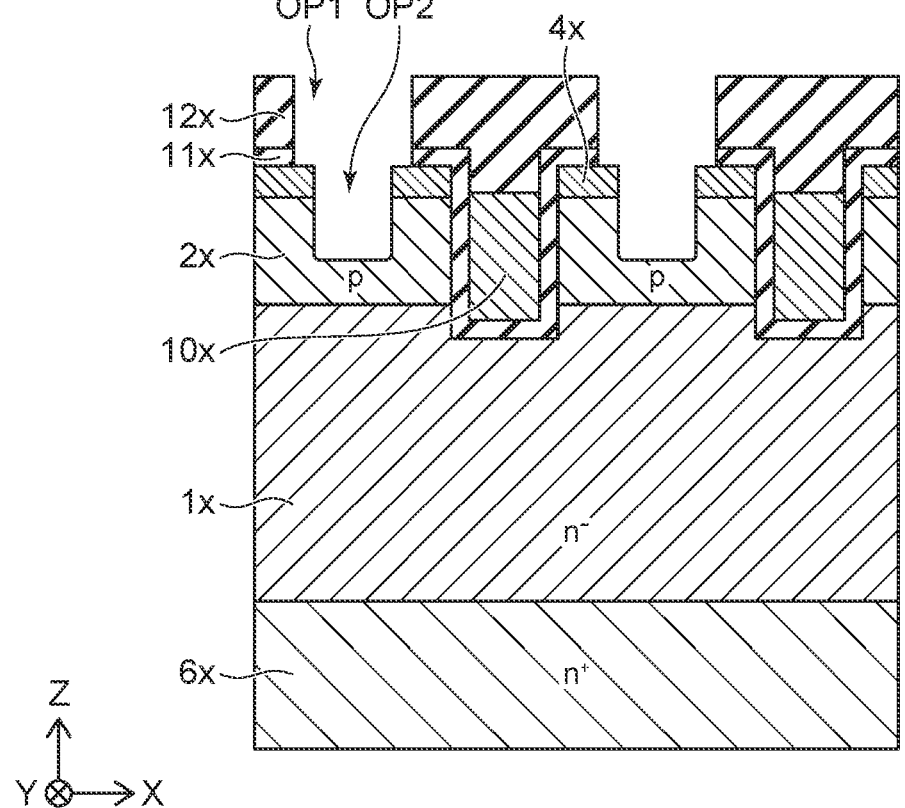

A portion of the p-type semiconductor region 2x and a portion of the $n^+$-type semiconductor region 4x are removed by RIE via the opening OP1 by using the insulating layers 11x and 12x as a mask. Thereby, the opening OP2 is formed in the p-type semiconductor region 2x and the $n^+$-type semiconductor region 4x. As shown in FIG. 9B, the width of the insulating layer 11x and the width of the insulating layer 12x are reduced by isotropic etching.

Figure 10A:
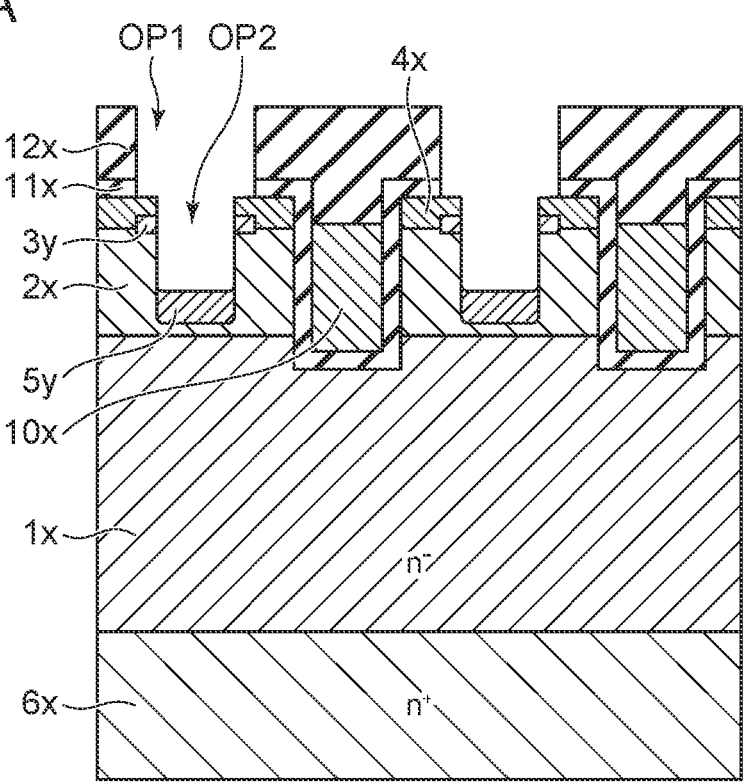
FIGS. 10A and 10B are cross-sectional views showing the method for manufacturing a semiconductor device according to the reference example.
Figure 10B:
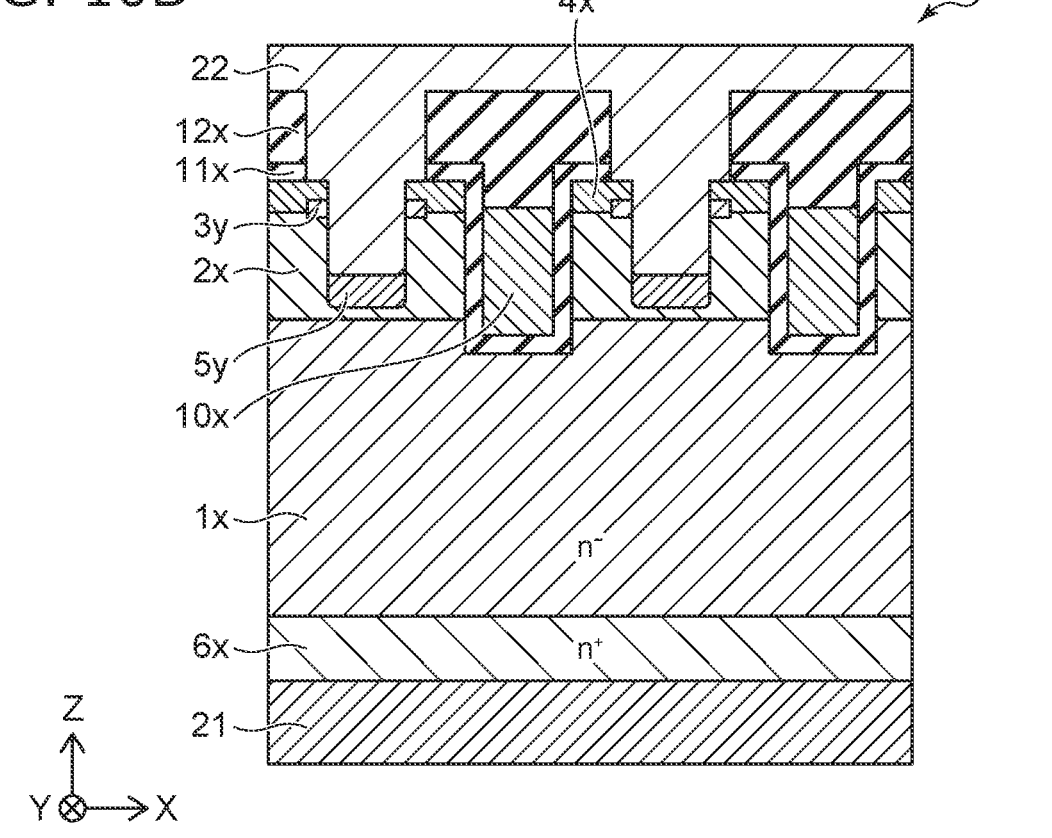

As shown in FIG. 10A, a p-type impurity is ion-implanted into the p-type semiconductor region 2x and the $n^+$-type semiconductor region 4x via the openings OP1 and OP2. Thereby, a $p^+$-type semiconductor region 3y is formed in portions of the two side surfaces of the opening OP2 as shown in FIG. 10B. A $p^+$-type semiconductor region 5y is formed at the bottom portion of the opening OP2. Subsequently, as shown in FIG. 10B, the semiconductor device 100r according to the reference example is manufactured by forming the drain electrode 21 and the source electrode 22.

According to the manufacturing method according to the reference example, the $p^+$-type semiconductor region 3y and the $p^+$-type semiconductor region 5y can be formed by one process. The number of processes necessary for manufacturing the semiconductor device can be reduced, and the productivity of the semiconductor device can be increased.

Figure 11:
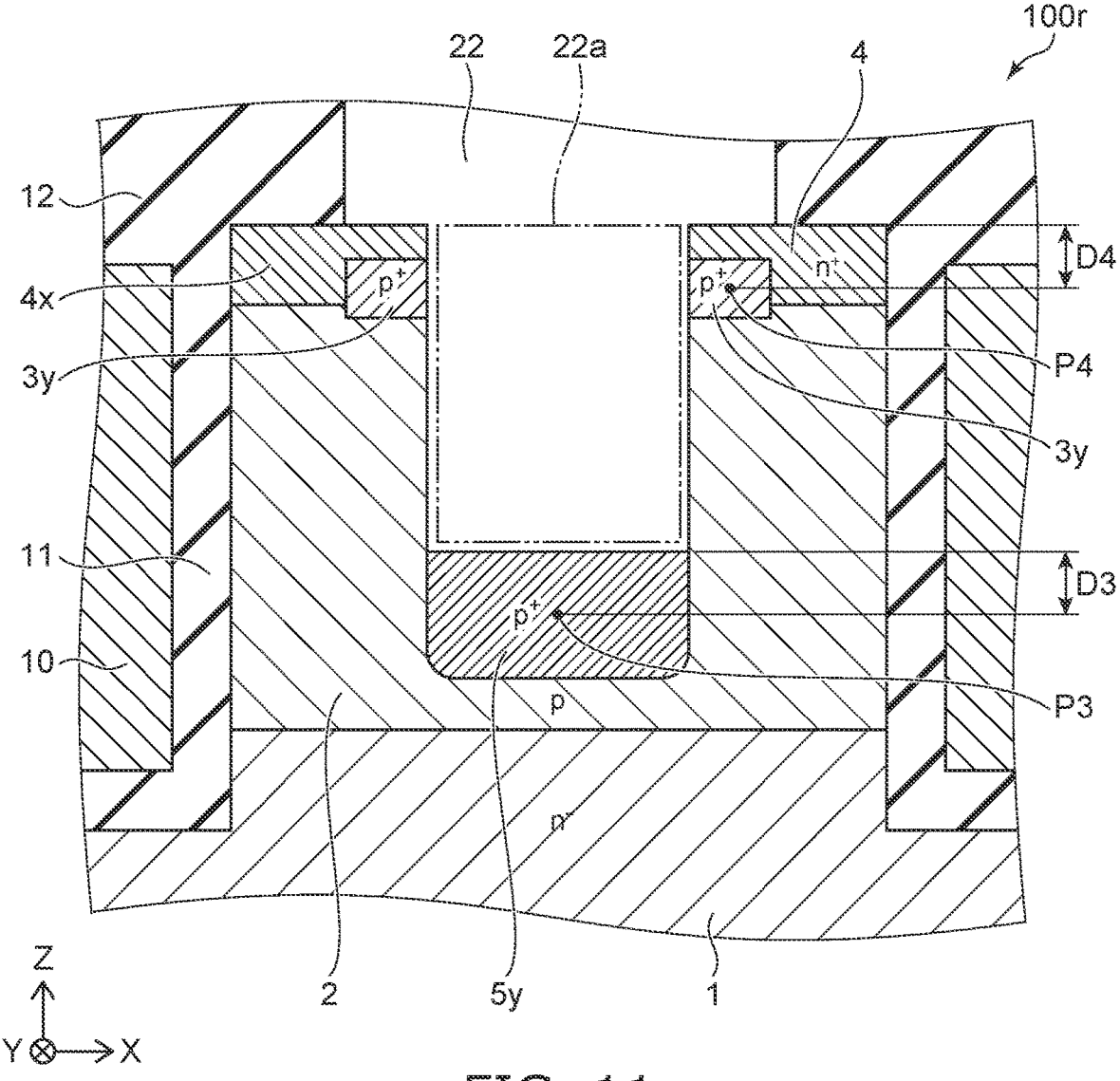
FIG. 11 is a cross-sectional view showing a portion of the semiconductor device according to the reference example.

FIG. 11 is a cross-sectional view showing a portion of the semiconductor device according to the reference example.

When the $p^+$-type semiconductor region 3y and the V-type semiconductor region 5y are simultaneously formed, the depth of the peak of the p-type impurity concentration of the $p^+$-type semiconductor region 3y is equal to the depth of the peak of the p-type impurity concentration of the $p^+$-type semiconductor region 5y. In other words, as shown in FIG. 11, a distance D3 is equal to a distance D4. The distance D3 is the distance from the interface between the $p^+$-type semiconductor region 5y and the connection part 22a to a position P3 of the peak of the p-type impurity concentration of the $p^+$-type semiconductor region 5y in the Z-direction. The distance D4 is the distance from the upper surface of the $n^+$-type semiconductor region 4x to the position P4 of the peak of the p-type impurity concentration of the $p^+$-type semiconductor region 3y in the Z-direction. Also, the p-type impurity concentration of the p$^+$-type semiconductor region 3$y$ is substantially equal to the p-type impurity concentration of the p$^+$-type semiconductor region 5$y$.

According to the semiconductor device 100$r$ and the manufacturing method according to the reference example, there is still room for improvement of the breakdown voltage or the electrical resistance between the n$^+$-type semiconductor region 4$x$ and the source electrode 22. To suppress the increase of the electrical resistance between the n$^+$-type semiconductor region 4$x$ and the source electrode 22, it is favorable for the p$^+$-type semiconductor region 3$y$ to be located below the n$^+$-type semiconductor region 4$x$. In other words, it is favorable for the distance D4 to be greater than the Z-direction thickness of the n$^+$-type semiconductor region 4$x$. This is because when the distance D4 is short, the p$^+$-type semiconductor region 3$y$ is formed to overlap the n$^+$-type semiconductor region 4$x$; and the electrical resistance between the n$^+$-type semiconductor region 4$x$ and the source electrode 22 is increased. On the other hand, the distance D3 also increases as the distance D4 increases. In other words, the p$^+$-type semiconductor region 5$y$ approaches the p-n junction between the n$^-$-type drift region 1 and the p-type base region 2. As a result, there is a possibility that the breakdown voltage of the semiconductor device 100$r$ may degrade.

According to the manufacturing method according to the first embodiment as shown in FIGS. 5B and 7A, the p$^+$-type semiconductor region 3$x$ and the p$^+$-type semiconductor region 5$x$ are formed in different processes. Therefore, the p-type impurity concentrations and the peak positions can be individually optimized for the p$^+$-type semiconductor region 3$x$ and the p$^+$-type semiconductor region 5$x$. Therefore, compared to the manufacturing method according to the reference example, the electrical resistance between the n$^+$-type semiconductor region 4$x$ and the source electrode 22 can be reduced, and the breakdown voltage of the semiconductor device 100 can be increased.

By reducing the width of the insulating layer 11$x$ and the width of the insulating layer 12$x$ after forming the p$^+$-type semiconductor region 3$x$ and the p$^+$-type semiconductor region 5$x$ as shown in FIG. 7B, a portion of the n$^+$-type semiconductor region 4$x$ can be exposed, and the contact area between the n$^+$-type semiconductor region 4$x$ and the source electrode 22 can be increased. When forming the p$^+$-type semiconductor region 3$x$ and the p$^+$-type semiconductor region 5$x$, the p-type impurity is not implanted into the portion of the n$^+$-type semiconductor region 4$x$ exposed in the process shown in FIG. 7B. Because the portion of the n$^+$-type semiconductor region 4$x$ contacts the source electrode 22, the electrical resistance between the n$^+$-type semiconductor region 4$x$ and the source electrode 22 can be further reduced.

First Modification

Figure 12:
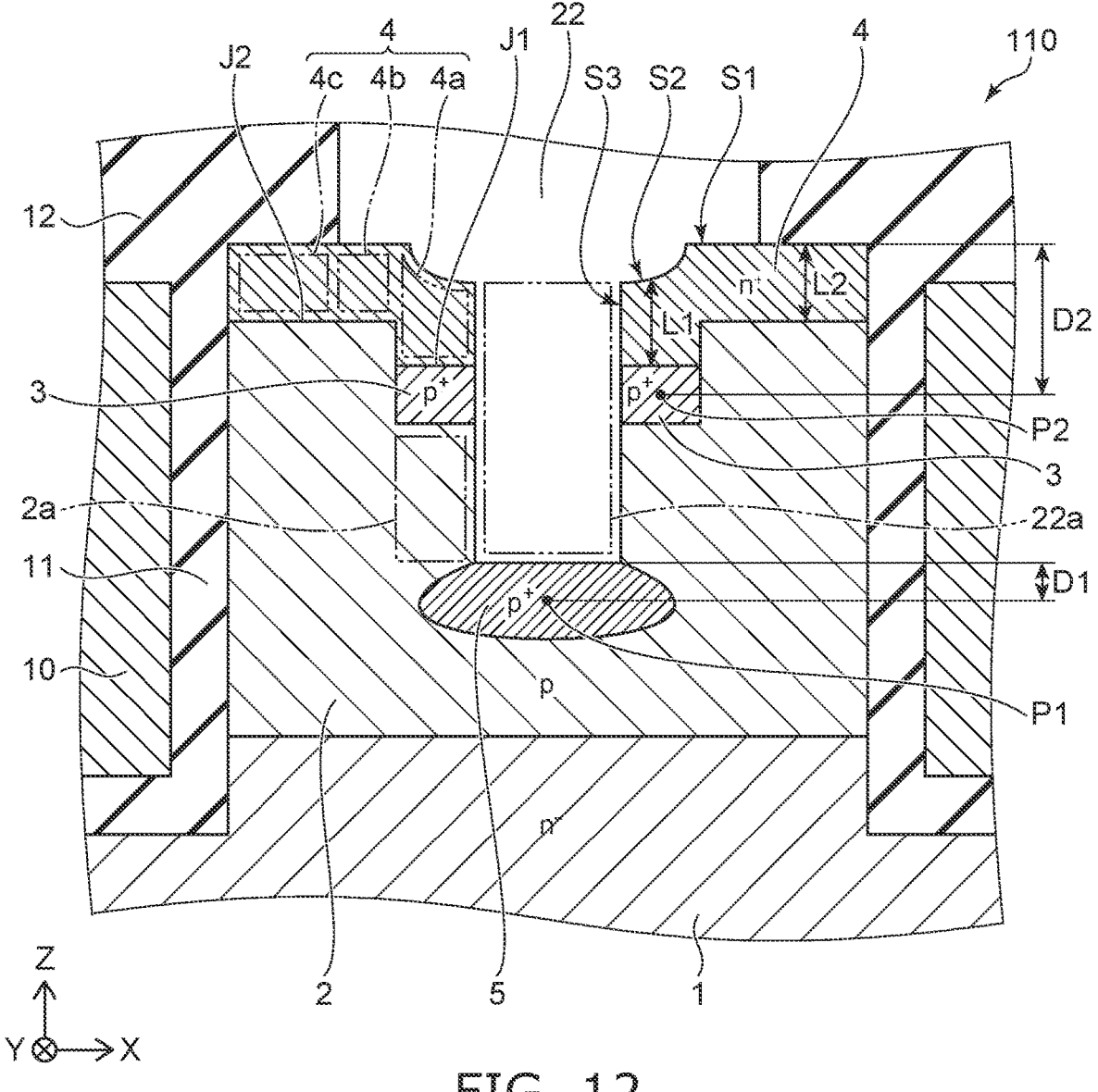
FIG. 12 is a cross-sectional view showing a portion of a semiconductor device according to a first modification of the first embodiment.

FIG. 12 is a cross-sectional view showing a portion of a semiconductor device according to a first modification of the first embodiment.

The shape of the n$^+$-type source region 4 of the semiconductor device 110 according to the first modification shown in FIG. 12 is different from that of the semiconductor device 100. Specifically, the lower end of the first portion 4$a$ is positioned lower than the lower end of the second portion 4$b$ and the lower end of the third portion 4$c$. For example, the length L1 in the Z-direction of the first portion 4$a$ is greater than the length L2 in the Z-direction of the second portion 4$b$. The first junction J1 is positioned lower than the second junction J2.

According to the first modification, compared to the semiconductor device 100, the contact area between the n$^+$-type source region 4 and the connection part 22$a$ can be increased. The electrical resistance between the n$^+$-type source region 4 and the connection part 22$a$ can be reduced thereby, and the on-resistance of the semiconductor device 110 can be reduced.

The contact area between the n$^+$-type source region 4 and the connection part 22$a$ also can be increased by increasing the thickness of the entire n$^+$-type source region 4. However, in such a case, the distance (the channel length) between the n$^-$-type drift region 1 and the third portion 4$c$ changes. The channel length is optimized for each semiconductor device by considering the operating voltage, etc. The operating voltage is the threshold of the voltage of the gate electrode 10 necessary for turning on the semiconductor device 110. When the channel length is changed, the operating voltage also is changed. For example, the stability of the operation of the semiconductor device 110 degrades.

According to the first modification, it is unnecessary to modify the distance between the n$^-$-type drift region 1 and the third portion 4$c$ to increase the contact area between the n$^+$-type source region 4 and the connection part 22$a$. Therefore, the on-resistance of the semiconductor device 110 can be reduced while maintaining the stability of the operation of the semiconductor device 110.

Second Modification

Figure 13:
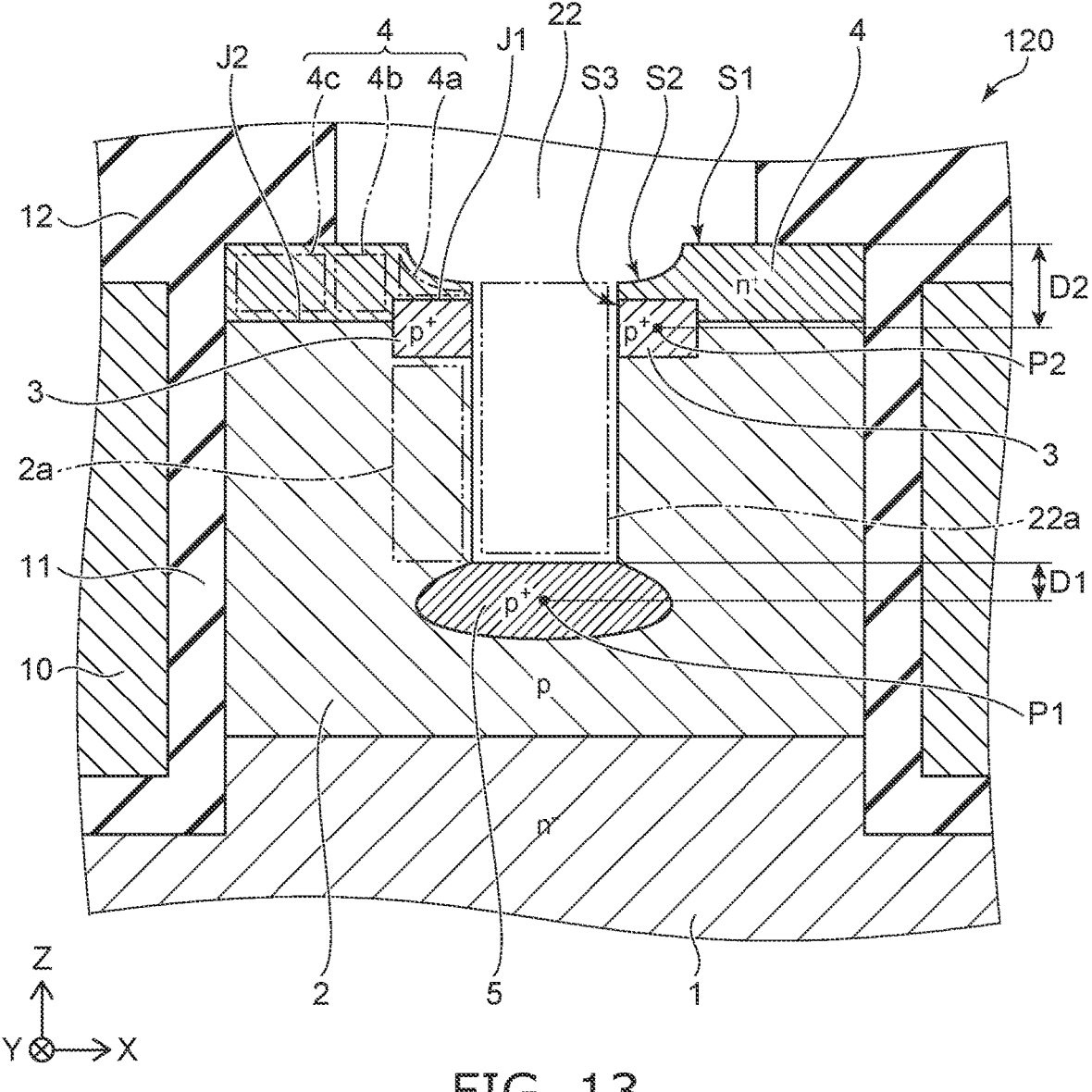
FIG. 13 is a cross-sectional view showing a portion of a semiconductor device according to a second modification of the first embodiment.

FIG. 13 is a cross-sectional view showing a portion of a semiconductor device according to a second modification of the first embodiment.

Compared to the semiconductor device 100, the p$^+$-type contact region 3 is positioned higher in the semiconductor device 120 according to the second modification shown in FIG. 13. The lower end of the first portion 4$a$ is positioned higher than the lower end of the second portion 4$b$ and the lower end of the third portion 4$c$. The first junction J1 is positioned higher than the second junction J2.

According to the second modification, compared to the semiconductor device 100, the contact area between the n$^+$-type source region 4 and the connection part 22$a$ is reduced; therefore, the electrical resistance between the n$^+$-type source region 4 and the connection part 22$a$ may be increased. On the other hand, the p$^+$-type contact region 3 is located in a region of higher electron concentration; therefore, compared to the semiconductor device 100, the fluctuation of the threshold of the voltage due to the diffusion of the p-type impurity can be further suppressed. As a result, compared to the semiconductor device 100, the characteristic fluctuation between the semiconductor devices 120 can be further suppressed, and the reliability of the semiconductor device 120 can be further improved.

According to the second modification as well, the first distance D1 from the interface between the p$^+$-type contact region 5 and the connection part 22$a$ to the first position P1 is less than the second distance D2 from the upper surface of the n$^+$-type source region 4 to the second position P2. Therefore, the breakdown voltage of the semiconductor device 120 can be increased.

Third Modification

Figure 14:
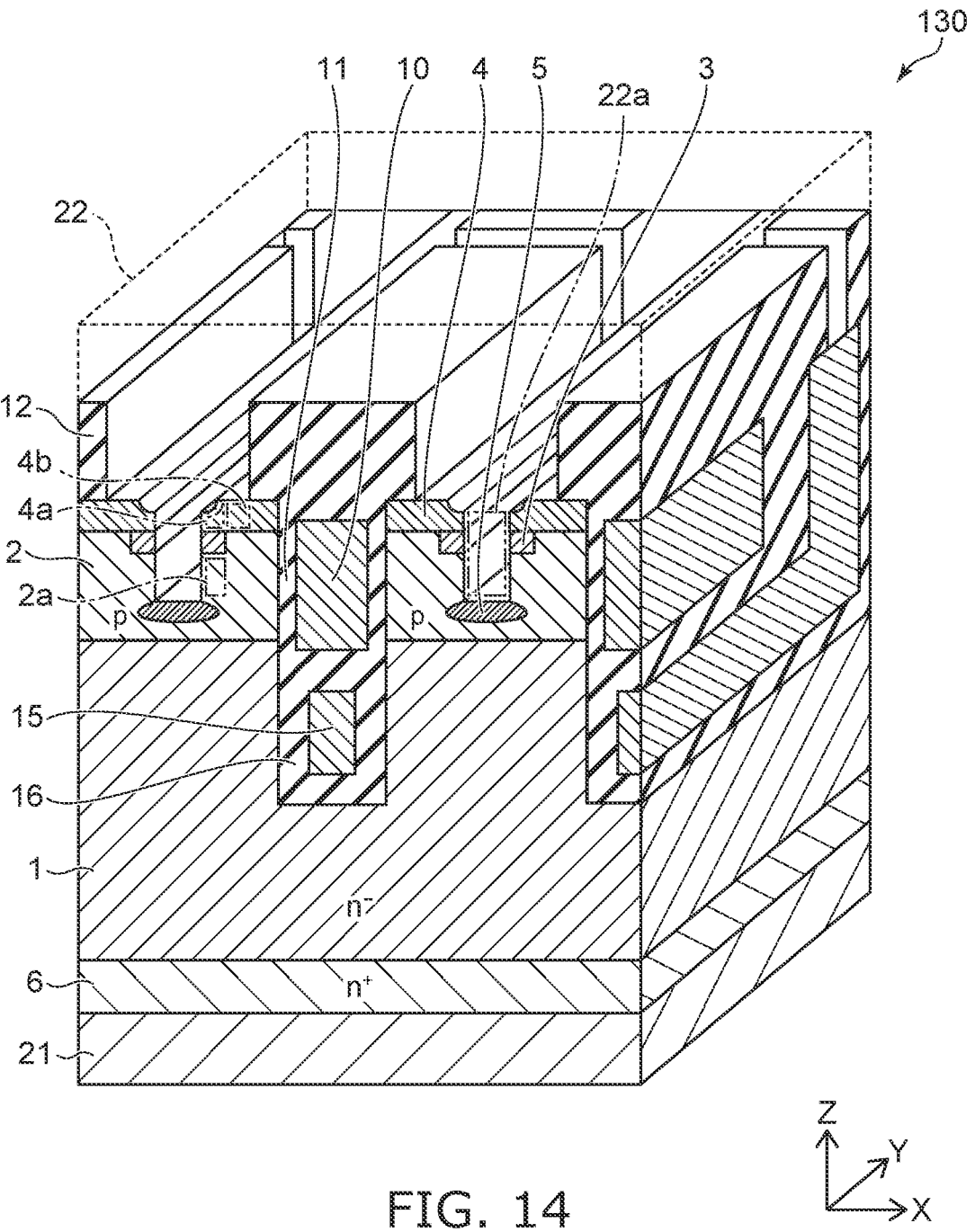
FIG. 14 is a cross-sectional view showing a portion of a semiconductor device according to a third modification of the first embodiment.

FIG. 14 is a cross-sectional view showing a portion of a semiconductor device according to a third modification of the first embodiment.

Compared to the semiconductor device 100, the semiconductor device 130 according to the third modification shown in FIG. 14 further includes a conductive part 15. The conductive part 15 is located inside the n⁻-type drift region 1 with an insulating part 16 interposed.

The gate electrode 10 is located on the conductive part 15. The gate electrode 10 is separated from the conductive part 15. For example, as shown in FIG. 14, the conductive part 15 extends in the Y-direction. The Y-direction end portion of the conductive part 15 is drawn upward and is electrically connected with the source electrode 22.

Or, the conductive part 15 may contact the gate electrode 10 inside the insulating part 16. In such a case, the conductive part 15 is electrically isolated from the source electrode 22.

Similarly to the semiconductor device 100, the semiconductor device 130 operates as a MOSFET. When the semiconductor device 130 is switched to the off-state, a depletion layer spreads from the interface between the n⁻-type drift region 1 and the insulating part 16 toward the n⁻-type drift region 1 according to the increase of the potential difference between the n⁻-type drift region 1 and the conductive part 15. The breakdown voltage of the semiconductor device 130 can be increased by the spreading of the depletion layer. Or, the on-resistance of the semiconductor device 130 can be reduced by increasing the n-type impurity concentration in the n⁻-type drift region 1 while maintaining the breakdown voltage of the semiconductor device 130.

Fourth Modification

Figure 15:
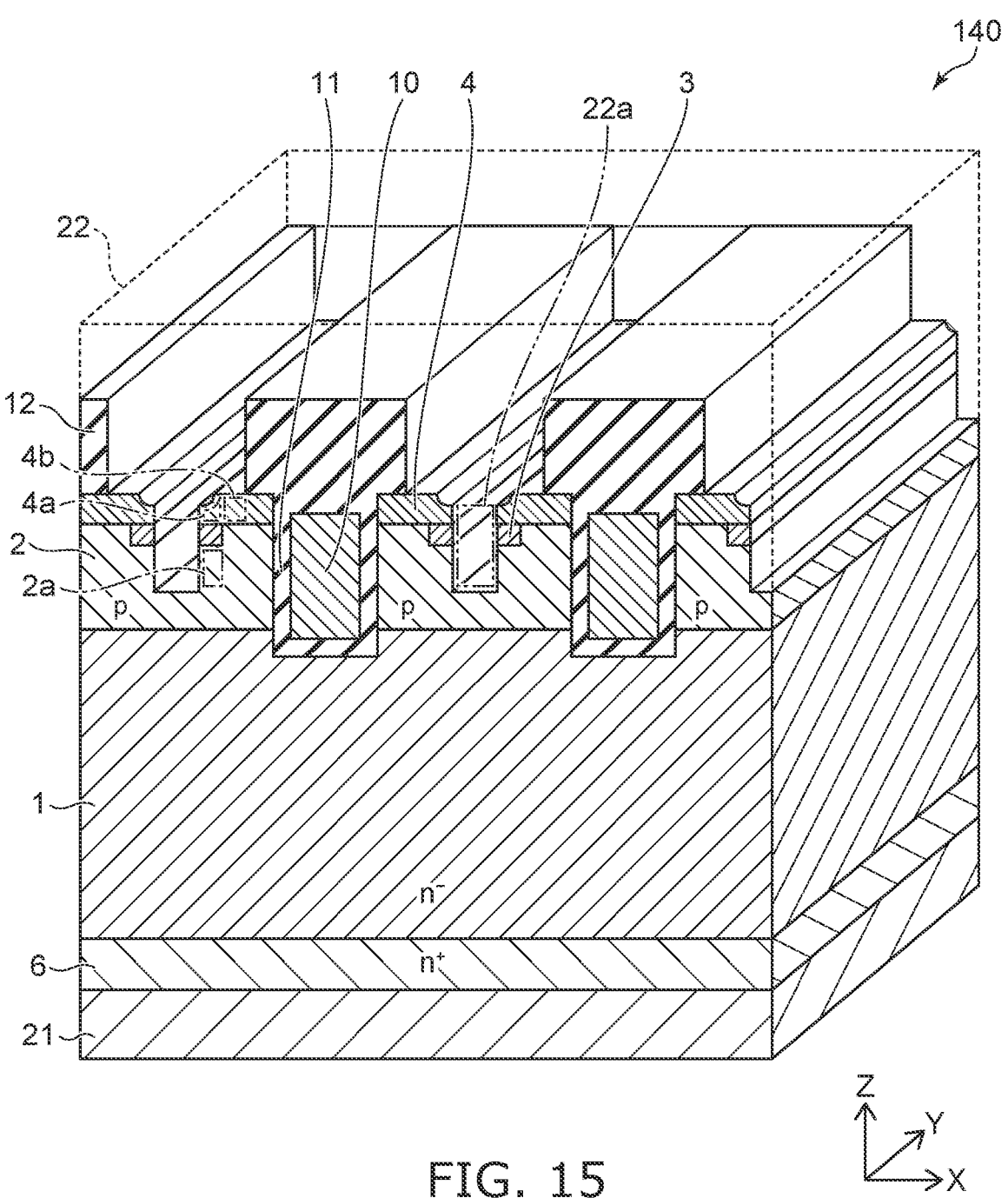
FIG. 15 is a cross-sectional view showing a portion of a semiconductor device according to a fourth modification of the first embodiment.

FIG. 15 is a cross-sectional view showing a portion of a semiconductor device according to a fourth modification of the first embodiment.

The semiconductor device 140 according to the fourth modification shown in FIG. 15 differs from the semiconductor device 100 in that the p⁺-type contact region 5 is not included.

When the p⁺-type contact region 5 is omitted, the conductance of holes from the p-type base region 2 to the source electrode 22 may be reduced. On the other hand, by omitting the high-concentration p-type semiconductor region, the electric field intensity at the vicinity of the p-n junction between the n⁻-type drift region 1 and the p-type base region 2 can be reduced. For example, the occurrence of avalanche breakdown at the vicinity of the p-n junction can be suppressed, and the generation of carriers by avalanche breakdown is suppressed. As a result, the operation of the parasitic bipolar transistor of the semiconductor device 140 can be suppressed. Breakdown of the semiconductor device 140 can be further suppressed.

The structures according to the modifications described above may be combined as appropriate. Specifically, the semiconductor device 110 or 120 also may include the conductive part 15 and the insulating part 16. The p⁺-type contact region 5 may be omitted from the semiconductor devices 110 to 130.

Second Embodiment

Figure 16:
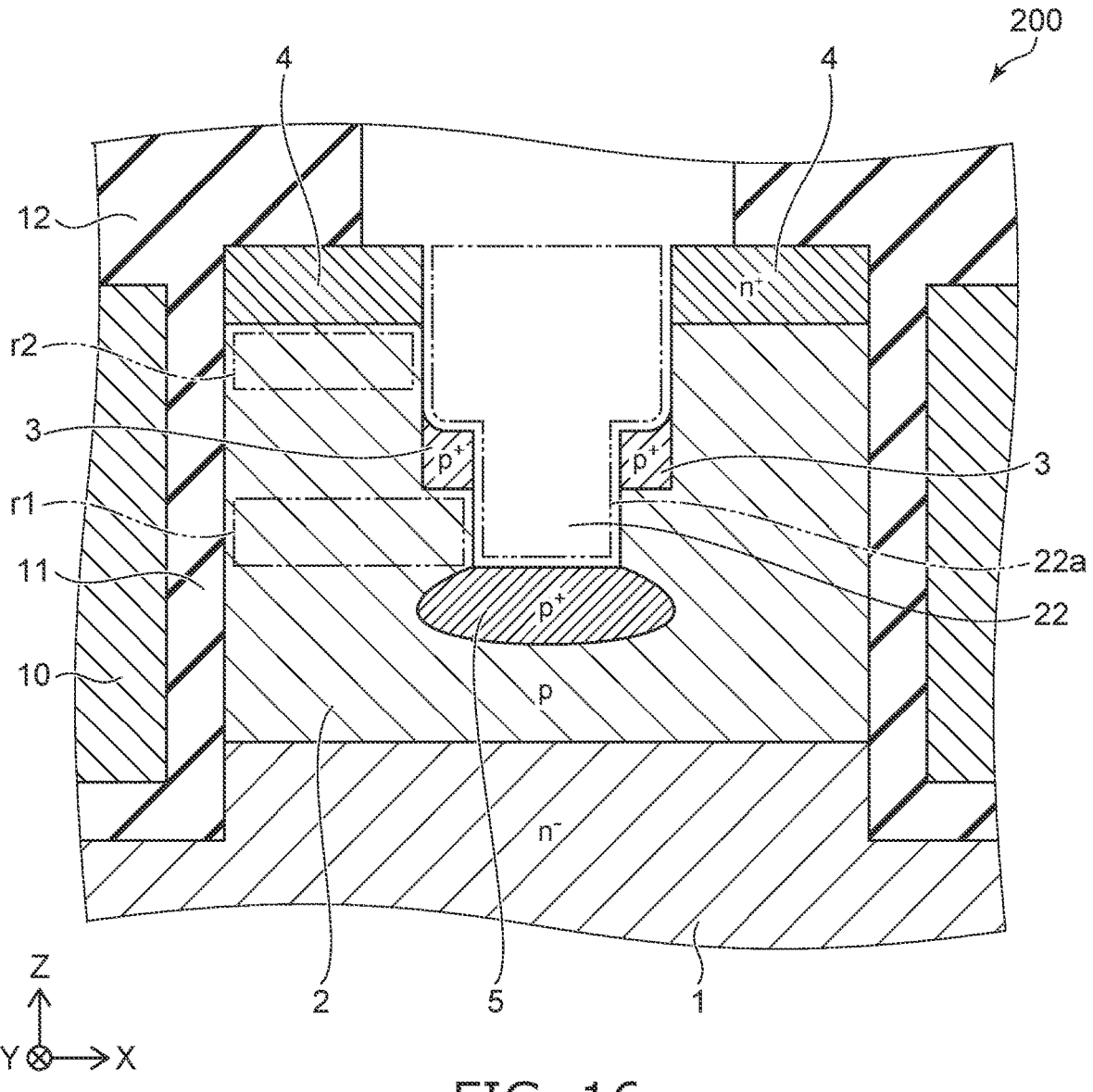
FIG. 16 is a cross-sectional view showing a portion of a semiconductor device according to a second embodiment.

FIG. 16 is a cross-sectional view showing a portion of a semiconductor device according to a second embodiment.

The shapes of the p-type base region 2 and the p⁺-type contact region 3 of the semiconductor device 200 according to the second embodiment are different from those of the semiconductor device 100 according to the first embodiment.

As shown in FIG. 16, the p-type base region 2 includes a first subregion r1 and a second subregion r2. The first subregion r1 is positioned higher than the p⁺-type contact region 5. The p⁺-type contact region 3 is located on a portion of the first subregion r1. The second subregion r2 is positioned higher than the p⁺-type contact region 3. The p⁺-type contact region 3 is separated from the n⁺-type source region 4 and the p⁺-type contact region 5.

The connection part 22a is arranged with the first subregion r1, the p⁺-type contact region 3, the second subregion r2, and the n⁺-type source region 4 in the X-direction. The width of the second subregion r2 is less than the width of the first subregion r1. Therefore, the width of the lower portion of the connection part 22a is less than the width of the upper portion of the connection part 22a.

Figure 17A:
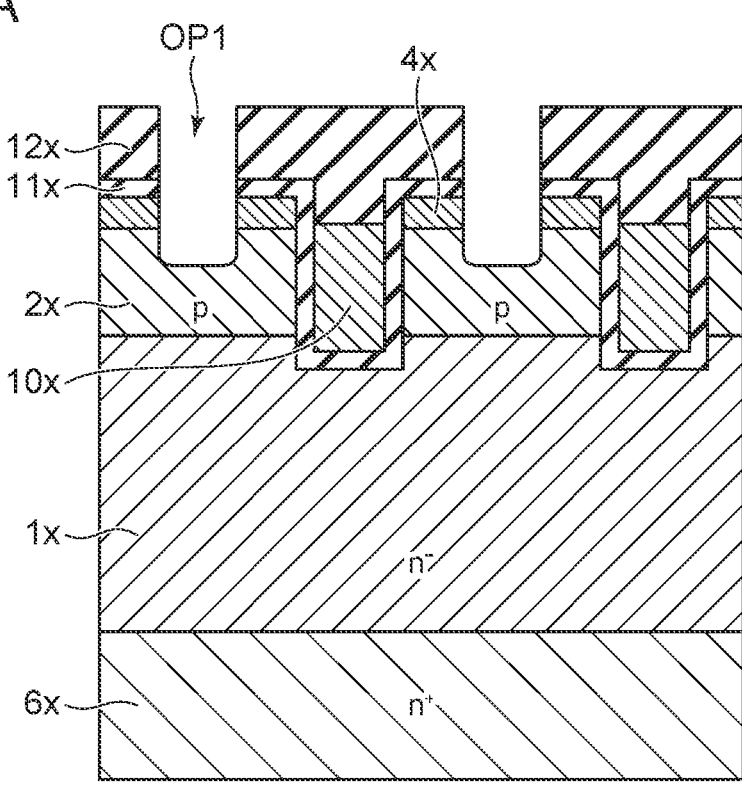
FIGS. 17A and 17B are cross-sectional views showing a method for manufacturing the semiconductor device according to the second embodiment.
Figure 17B:
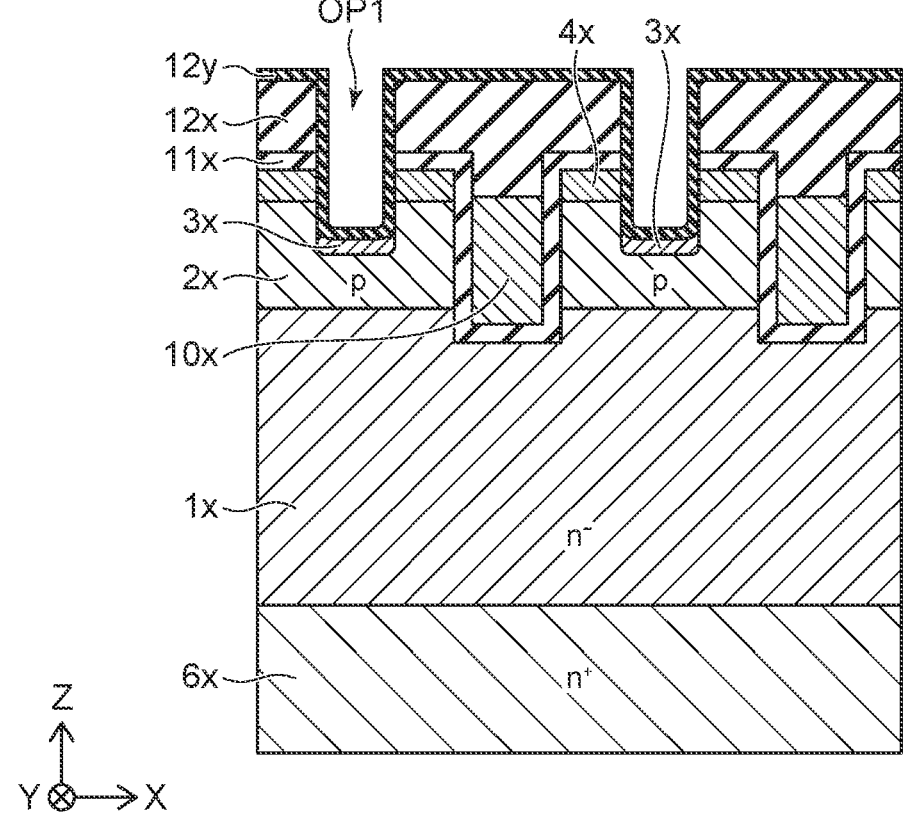
Figure 18:
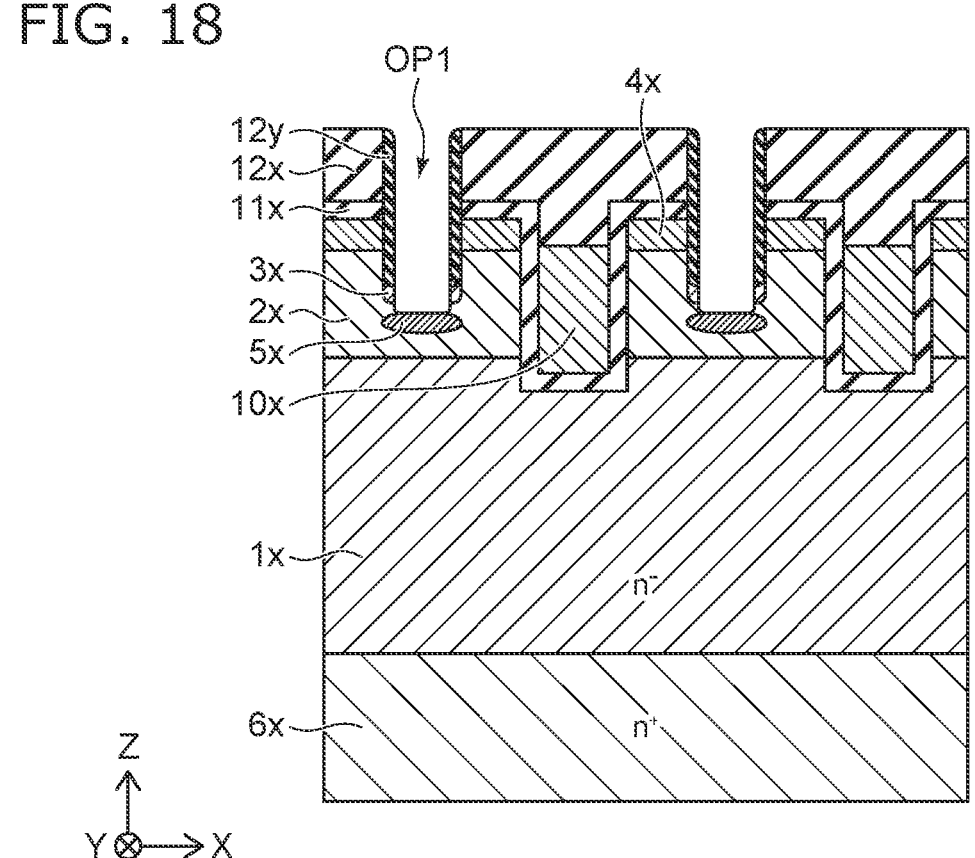
FIG. 18 is a cross-sectional view showing the method for manufacturing the semiconductor device according to the second embodiment.

FIG. 17A, FIG. 17B, and FIG. 18 are cross-sectional views showing a method for manufacturing the semiconductor device according to the second embodiment.

First, the opening OP1 is formed similarly to the example shown in FIGS. 4A to 5A. At this time, the opening OP1 that extends through the n⁺-type semiconductor region 4x is formed. The p-type semiconductor region 2x is exposed at the bottom portion of the opening OP1.

The p⁺-type semiconductor region 3x is formed by ion-implanting a p-type impurity into the bottom portion of the opening OP1 by using the insulating layer 12x as a mask. As shown in FIG. 17B, the insulating layer 12y is formed along the upper surface of the insulating layer 12x and the inner surface of the opening OP1 by CVD.

The insulating layer 12y that is located at the upper surface of the insulating layer 12x and the bottom portion of the opening OP1 is removed by RIE. A portion of the p-type semiconductor region 2x and a portion of the p⁺-type semiconductor region 3x are removed by RIE via the opening OP1 by using the insulating layers 12x and 12y as a mask. Thereby, the opening OP2 is formed in the bottom portion of the opening OP1. The p⁺-type semiconductor region 5x is formed as shown in FIG. 18 by ion-implanting a p-type impurity into the p-type semiconductor region 2x via the opening OP2.

Subsequently, the insulating layer 12y is removed similarly to the example shown in FIGS. 7B to 8B. The width of the insulating layer 11x and the width of the insulating layer 12x are reduced. The source electrode 22 and the drain electrode 21 are formed. The semiconductor device 200 according to the second embodiment is manufactured by the processes described above.

According to the second embodiment, the p⁺-type contact region 3 can be formed at a position that is more distant to the gate insulating layer 11. Therefore, the fluctuation of the threshold of the voltage due to the diffusion of the p-type impurity included in the p⁺-type contact region 3 can be suppressed. As a result, the characteristic fluctuation between the semiconductor devices 200 can be suppressed, and the reliability of the semiconductor device 200 can be increased.

The p⁺-type contact region 3 is separated from the n⁺-type source region 4. The effects on the n-type impurity concentration of the n⁺-type source region 4 are small when forming the p⁺-type contact region 3. Therefore, compared to the semiconductor device according to the reference example, the electrical resistance between the n⁺-type source region 4 and the source electrode 22 can be reduced and the on-resistance of the semiconductor device 200 can be reduced.

Specifically, a p-type impurity is not implanted into the n⁺-type semiconductor region 4x when forming the p⁺-type semiconductor region 3x as shown in FIG. 17B. Therefore, the reduction of the n-type impurity concentration of the n⁺-type semiconductor region 4x can be suppressed.

Structures of modifications according to the first embodiment are applicable to the second embodiment as well. For example, the semiconductor device 200 may include the conductive part 15 and the insulating part 16. The p⁺-type contact region 5 may be omitted from the semiconductor device 200.

The embodiments according to the present invention may include the following configurations.

(Configuration 1)

A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type;

a third semiconductor region located on a portion of the second semiconductor region, the third semiconductor region being of the second conductivity type, a second-conductivity-type impurity concentration of the third semiconductor region being greater than a second-conductivity-type impurity concentration of the second semiconductor region;

a fourth semiconductor region including a first portion and a second portion, the fourth semiconductor region being of the first conductivity type, the first portion being positioned on the third semiconductor region, the second portion being arranged with the first portion in a second direction perpendicular to a first direction, the first direction being from the first electrode toward the first semiconductor region, a first-conductivity-type impurity concentration of the first portion being less than a first-conductivity-type impurity concentration of the second portion;

a gate electrode facing the second semiconductor region via a gate insulating layer in the second direction; and a second electrode located on the second and fourth semiconductor regions, the second electrode contacting the first and second portions, the second electrode including a connection part, the connection part contacting the third semiconductor region and the portion of the second semiconductor region in the second direction.

(Configuration 2)

The device according to configuration 1, further comprising:

a fifth semiconductor region located between the second semiconductor region and the connection part in the first direction, the fifth semiconductor region being of the second conductivity type;

a second-conductivity-type impurity concentration of the fifth semiconductor region being greater than the second-conductivity-type impurity concentration of the second semiconductor region, the third semiconductor region being separated from the fifth semiconductor region.

(Configuration 3)

The device according to configuration 2, wherein the second-conductivity-type impurity concentration of the third semiconductor region is less than the second-conductivity-type impurity concentration of the fifth semiconductor region.

(Configuration 4)

The device according to configuration 2 or 3, wherein the fifth semiconductor region has a peak of the second-conductivity-type impurity concentration at a first position in the first direction, the third semiconductor region has a peak of the second-conductivity-type impurity concentration at a second position in the first direction, and a first distance in the first direction from an interface between the fifth semiconductor region and the connection part to the first position is less than a second distance in the first direction from an upper surface of the fourth semiconductor region to the second position.

(Configuration 5)

The device according to any one of configurations 1 to 4, wherein a lower end of the first portion is positioned lower than a lower end of the second portion.

(Configuration 6)

The device according to any one of configurations 1 to 5, wherein an upper surface of the first portion is oblique to the first and second directions, and an upper surface of the second portion is along the first direction.

(Configuration 7)

The device according to any one of configurations 1 to 6, wherein the third semiconductor region is located around the connection part along a first plane perpendicular to the first direction.

(Configuration 8)

A semiconductor device, comprising:

a first electrode;

a first semiconductor region located on the first electrode, the first semiconductor region being of a first conductivity type;

a second semiconductor region located on the first semiconductor region, the second semiconductor region being of a second conductivity type, the second semiconductor region including a first subregion, and a second subregion positioned on the first subregion;

a third semiconductor region located on a portion of the first subregion and positioned lower than the second subregion, the third semiconductor region being of the second conductivity type and having a higher second-conductivity-type impurity concentration than the second semiconductor region;

a fourth semiconductor region located on the second subregion, the fourth semiconductor region being of the first conductivity type;

a gate electrode facing the second semiconductor region via a gate insulating layer in a second direction perpendicular to a first direction, the first direction being from the first electrode toward the first semiconductor region; and a second electrode located on the second and fourth semiconductor regions, the second electrode including a connection part, the connection part contacting the first subregion, the second subregion, and the third semiconductor region in the second direction.

According to embodiments described above, a semiconductor device and a method for manufacturing a semiconductor device are provided in which the on-resistance can be reduced.

It is possible to confirm the relative levels of the impurity concentrations of the semiconductor regions in the embodiments described above, for example, using a scanning capacitance microscope (SCM). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a secondary ion mass spectrometer (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
a first electrode;
a first semiconductor region located on the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the second conductivity type, a second-conductivity-type impurity concentration of the third semiconductor region being greater than a second-conductivity-type impurity concentration of the second semiconductor region;
a fourth semiconductor region of the first conductivity type,
the fourth semiconductor region including
a first portion positioned on the third semiconductor region, an upper surface of the first portion being oblique to a first direction and a second direction, the first direction being from the first electrode toward the first semiconductor region, the second direction being perpendicular to the first direction, and
a second portion aligned with the first portion in the second direction, a first-conductivity-type impurity concentration of the first portion being less than a first-conductivity-type impurity concentration of the second portion, an upper surface of the second portion being along the second direction;
a gate electrode facing the second semiconductor region via a gate insulating layer in the second direction; and
a second electrode located on the second and fourth semiconductor regions, the second electrode contacting the first and second portions, the second electrode including a connection part, the connection part contacting the third semiconductor region and the portion of the second semiconductor region in the second direction, the first portion being positioned between the connection part and the second portion in the second direction.

2. The device according to claim 1, further comprising:
a fifth semiconductor region located between the second semiconductor region and the connection part in the first direction, the fifth semiconductor region being of the second conductivity type;
a second-conductivity-type impurity concentration of the fifth semiconductor region being greater than the second-conductivity-type impurity concentration of the second semiconductor region,
the third semiconductor region being separated from the fifth semiconductor region.

3. The device according to claim 2, wherein
the second-conductivity-type impurity concentration of the third semiconductor region is less than the second-conductivity-type impurity concentration of the fifth semiconductor region.

4. The device according to claim 2, wherein
the fifth semiconductor region has a peak of the second-conductivity-type impurity concentration at a first position in the first direction,
the third semiconductor region has a peak of the second-conductivity-type impurity concentration at a second position in the first direction, and
a first distance in the first direction from an interface between the fifth semiconductor region and the connection part to the first position is less than a second distance in the first direction from an upper surface of the fourth semiconductor region to the second position.

5. The device according to claim 1, wherein
a lower end of the first portion is positioned lower than a lower end of the second portion.

6. The device according to claim 1, wherein
the third semiconductor region is located around the connection part along a first plane perpendicular to the first direction.

7. A semiconductor device, comprising:
a first electrode;
a first semiconductor region located on the first electrode, the first semiconductor region being of a first conductivity type;
a second semiconductor region located on the first semiconductor region, the second semiconductor region being of a second conductivity type;
a third semiconductor region located on a portion of the second semiconductor region, the third semiconductor region being of the second conductivity type, a second-conductivity-type impurity concentration of the third semiconductor region being greater than a second-conductivity-type impurity concentration of the second semiconductor region;
a fourth semiconductor region of the first conductivity type, the fourth semiconductor region including
a first portion positioned on the third semiconductor region, an upper surface of the first portion being oblique to a first direction and a second direction, the first direction being from the first electrode toward the first semiconductor region, the second direction being perpendicular to the first direction, and
a second portion aligned with the first portion in the second direction, a first-conductivity-type impurity concentration of the first portion being less than a first-conductivity-type impurity concentration of the second portion, an upper surface of the second portion being along the second direction;
a gate electrode facing the second semiconductor region via a gate insulating layer in the second direction;
a second electrode located on the second and fourth semiconductor regions, the second electrode including a connection part, the connection part contacting the third semiconductor region and the portion of the second semiconductor region in the second direction, the first portion being positioned between the connection part and the second portion in the second direction; and a fifth semiconductor region located between the second semiconductor region and the connection part in the first direction, the fifth semiconductor region being separated from the third semiconductor region, the fifth semiconductor region being of the second conductivity type, a second-conductivity-type impurity concentration of the fifth semiconductor region being greater than the second-conductivity-type impurity concentration of the second semiconductor region, a first distance from an interface between the fifth semiconductor region and the connection part to a peak position of the second-conductivity-type impurity concentration of the fifth semiconductor region in the first direction being less than a second distance from an upper surface of the fourth semiconductor region to a peak position of the second-conductivity-type impurity concentration of the third semiconductor region in the first direction.

8. The device according to claim 1, wherein
the first portion contacts the second electrode, and
the second portion contacts the gate insulating layer.

9. The device according to claim 1, wherein
the first portion is positioned between the third semiconductor region and a portion of the second electrode in the first direction.

10. The device according to claim 1, wherein
the fourth semiconductor region includes a third portion,
the first-conductivity-type impurity concentration of the first portion is less than a first-conductivity-type impurity concentration of the second portion, and
the second portion is positioned between the first portion and the third portion in the second direction.

11. The device according to claim 10, further comprising an insulating layer,
at least a portion of the insulating layer being positioned directly above the third portion,
a portion of the second electrode being positioned directly above the second portion.

12. The device according to claim 1, wherein
a thickness of the first portion in the first direction is less than a thickness of the second portion in the first direction.

13. The device according to claim 7, wherein
the first portion contacts the second electrode, and
the second portion contacts the gate insulating layer.

14. The device according to claim 7, wherein
the first portion is positioned between the third semiconductor region and a portion of the second electrode in the first direction.

15. The device according to claim 7, wherein
the fourth semiconductor region includes a third portion,
the first-conductivity-type impurity concentration of the first portion is less than a first-conductivity-type impurity concentration of the second portion, and
the second portion is positioned between the first portion and the third portion in the second direction.

16. The device according to claim 15, further comprising an insulating layer,
at least a portion of the insulating layer being positioned directly above the third portion,
a portion of the second electrode being positioned directly above the second portion.

17. The device according to claim 7, wherein
a thickness of the first portion in the first direction is less than a thickness of the second portion in the first direction.

*   *   *   *   *